United States Patent
Kim et al.

(10) Patent No.: US 12,187,942 B2
(45) Date of Patent: *Jan. 7, 2025

(54) CADMIUM FREE QUANTUM DOT INCLUDING LITHIUM, PRODUCTION METHOD THEREOF, AND ELECTRONIC DEVICE INCLUDING THE SAME

(71) Applicant: SAMSUNG ELECTRONICS CO., LTD., Suwon-si (KR)

(72) Inventors: Yong Wook Kim, Yongin-si (KR); Eun Joo Jang, Suwon-si (KR); Hyo Sook Jang, Suwon-si (KR); Soo Kyung Kwon, Suwon-si (KR); Seon-Yeong Kim, Suwon-si (KR); Ji-Yeong Kim, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/297,033

(22) Filed: Apr. 7, 2023

(65) Prior Publication Data
US 2023/0250336 A1  Aug. 10, 2023

Related U.S. Application Data

(63) Continuation of application No. 16/851,520, filed on Apr. 17, 2020, now Pat. No. 11,739,263.

(30) Foreign Application Priority Data

Apr. 18, 2019 (KR) .......... 10-2019-0045758

(51) Int. Cl.
*C09K 11/88* (2006.01)
*C09K 11/02* (2006.01)
(Continued)

(52) U.S. Cl.
CPC .......... *C09K 11/883* (2013.01); *C09K 11/025* (2013.01); *C09K 11/0805* (2013.01);
(Continued)

(58) Field of Classification Search
CPC .................................. C09K 11/883
See application file for complete search history.

(56) References Cited

U.S. PATENT DOCUMENTS 6,288,285 B1   9/2001 Aoki et al.
6,322,901 B1  11/2001 Bawendi et al.
(Continued)

FOREIGN PATENT DOCUMENTS

CN   101974335 A    2/2011
CN   102239109 A   11/2011
(Continued)

OTHER PUBLICATIONS

Chunliang Li et al., "Synthesis of Cd-free water-soluble ZnSe1—xTex nanocrystals with high luminescence in the blue region," Journal of Colloid and Interface Science, Feb. 14, 2008, pp. 468-476, vol. 321.
(Continued)

*Primary Examiner* — Matthew E. Hoban
(74) *Attorney, Agent, or Firm* — CANTOR COLBURN LLP

(57) ABSTRACT

A cadmium free quantum dot includes zinc, tellurium, and selenium, and lithium. A full width at half maximum of a maximum luminescent peak of the cadmium free quantum dot is less than or equal to about 50 nanometers and the cadmium free quantum dot has a quantum efficiency of greater than 1%.

17 Claims, 7 Drawing Sheets

(51) Int. Cl.
  *C09K 11/08* (2006.01)
  *C09K 11/56* (2006.01)
  *F21V 8/00* (2006.01)
  *G02F 1/13357* (2006.01)
  *H10K 59/12* (2023.01)
  *H10K 59/38* (2023.01)
  *B82Y 20/00* (2011.01)
  *B82Y 40/00* (2011.01)

(52) U.S. Cl.
  CPC ............ *C09K 11/562* (2013.01); *C09K 11/88* (2013.01); *G02B 6/005* (2013.01); *G02F 1/133617* (2013.01); *H10K 59/12* (2023.02); *H10K 59/38* (2023.02); *B82Y 20/00* (2013.01); *B82Y 40/00* (2013.01)

(56) References Cited

U.S. PATENT DOCUMENTS

| | | |
|---|---|---|
| 6,861,155 B2 | 3/2005 | Bawendi et al. |
| 7,105,051 B2 | 9/2006 | Peng et al. |
| 7,288,468 B2 | 10/2007 | Jang et al. |
| 7,427,523 B2 | 9/2008 | Boardman et al. |
| 7,641,815 B2 | 1/2010 | Varadarajan et al. |
| 7,981,667 B2 | 7/2011 | Nie |
| 8,035,772 B2 | 10/2011 | Kim et al. |
| 8,252,205 B2 | 8/2012 | Jun et al. |
| 8,420,155 B2 | 4/2013 | Nie et al. |
| 8,436,964 B2 | 5/2013 | Kim et al. |
| 8,545,736 B2 | 10/2013 | Jun et al. |
| 8,952,239 B2 | 2/2015 | Pfenninger et al. |
| 9,082,982 B2 | 7/2015 | Jun et al. |
| 9,412,916 B2 | 8/2016 | Xu et al. |
| 9,517,936 B2 | 12/2016 | Jeong et al. |
| 9,537,059 B2 | 1/2017 | Xu et al. |
| 9,577,127 B1 | 2/2017 | Wang et al. |
| 9,606,281 B2 | 3/2017 | Jang et al. |
| 9,698,311 B2 | 7/2017 | Greco et al. |
| 9,834,724 B2 | 12/2017 | Kim et al. |
| 9,933,658 B2 | 4/2018 | Jang et al. |
| 9,937,560 B2 | 4/2018 | Tulsky et al. |
| 10,074,770 B2 | 9/2018 | Park et al. |
| 10,090,443 B2 | 10/2018 | Xu et al. |
| 10,160,649 B2 | 12/2018 | Jang et al. |
| 10,270,036 B2 | 4/2019 | Mitsunori et al. |
| 10,424,695 B2 | 9/2019 | Won et al. |
| 10,436,973 B2 | 10/2019 | Wang et al. |
| 10,446,782 B1 | 10/2019 | Han et al. |
| 10,472,562 B2 | 11/2019 | Lee et al. |
| 10,559,712 B2 | 2/2020 | Park et al. |
| 10,597,580 B2 | 3/2020 | Min et al. |
| 10,717,649 B2 | 7/2020 | Jang et al. |
| 10,725,340 B2 | 7/2020 | Park et al. |
| 10,732,458 B2 | 8/2020 | Jang et al. |
| 10,954,440 B2 | 3/2021 | Won et al. |
| 10,988,685 B2 | 4/2021 | Ahn et al. |
| 11,319,487 B2 | 5/2022 | Lee et al. |
| 11,326,097 B2 | 5/2022 | Lee et al. |
| 11,355,583 B2 | 6/2022 | Kwon et al. |
| 11,513,385 B2 | 11/2022 | Park et al. |
| 11,515,453 B2 | 11/2022 | Heiden et al. |
| 11,525,083 B2 * | 12/2022 | Kwon .................. C09K 11/025 |
| 11,530,354 B2 | 12/2022 | Kim et al. |
| 11,572,504 B2 | 2/2023 | Kim et al. |
| 11,603,493 B2 * | 3/2023 | Min ...................... H10K 59/12 |
| 11,692,136 B2 * | 7/2023 | Kim ...................... H10K 50/115 257/40 |
| 11,739,263 B2 * | 8/2023 | Kim ...................... C09K 11/883 252/301.6 R |
| 11,866,630 B2 | 1/2024 | Kim et al. |
| 2005/0102178 A1 | 5/2005 | Phillips et al. |
| 2005/0214536 A1 | 9/2005 | Schrier et al. |
| 2006/0157720 A1 | 7/2006 | Bawendi et al. |
| 2008/0138514 A1 | 6/2008 | Jang et al. |
| 2010/0110728 A1 | 5/2010 | Dubrow et al. |
| 2010/0283072 A1 | 11/2010 | Kazlas et al. |
| 2011/0175059 A1 | 7/2011 | Kahen et al. |
| 2011/0245533 A1 | 10/2011 | Breen et al. |
| 2011/0300076 A1 | 12/2011 | Tulsky et al. |
| 2012/0037883 A1 | 2/2012 | Jiang et al. |
| 2012/0113671 A1 | 5/2012 | Sadasivan et al. |
| 2012/0113672 A1 | 5/2012 | Dubrow et al. |
| 2013/0299772 A1 | 11/2013 | Cohen et al. |
| 2013/0320370 A1 | 12/2013 | Schubert et al. |
| 2014/0326949 A1 | 11/2014 | Xu et al. |
| 2014/0339495 A1 | 11/2014 | Bibl et al. |
| 2015/0176777 A1 | 6/2015 | Hikmet et al. |
| 2015/0221619 A1 | 8/2015 | Rhee |
| 2016/0096992 A1 | 4/2016 | Guo et al. |
| 2016/0167965 A1 | 6/2016 | Jang et al. |
| 2016/0190105 A1 | 6/2016 | Rhee et al. |
| 2016/0190515 A1 | 6/2016 | Huang et al. |
| 2016/0268484 A1 | 9/2016 | Xu et al. |
| 2017/0059988 A1 | 3/2017 | Paek et al. |
| 2017/0110633 A1 | 4/2017 | Xu et al. |
| 2017/0117444 A1 | 4/2017 | Stoll et al. |
| 2017/0306227 A1 | 10/2017 | Ippen et al. |
| 2017/0335187 A1 | 11/2017 | Guo et al. |
| 2017/0346024 A1 | 11/2017 | Lee et al. |
| 2018/0033856 A1 | 2/2018 | Kwon et al. |
| 2018/0094190 A1 | 4/2018 | Kim et al. |
| 2018/0119007 A1 | 5/2018 | Ippen et al. |
| 2018/0151817 A1 | 5/2018 | Cho et al. |
| 2018/0180944 A1 | 6/2018 | Jang et al. |
| 2018/0327665 A1 | 11/2018 | Lee et al. |
| 2019/0064591 A1 | 2/2019 | Lee et al. |
| 2019/0086733 A1 | 3/2019 | Min et al. |
| 2019/0097101 A1 | 3/2019 | Dorman |
| 2019/0112527 A1 | 4/2019 | Moriyama et al. |
| 2019/0115492 A1 | 4/2019 | Tamma et al. |
| 2019/0119569 A1 | 4/2019 | Lee et al. |
| 2019/0153317 A1 | 5/2019 | Kim et al. |
| 2019/0198728 A1 | 6/2019 | Tamma et al. |
| 2019/0211265 A1 | 7/2019 | Park et al. |
| 2019/0257003 A1 | 8/2019 | Kim et al. |
| 2019/0276734 A1 | 9/2019 | Kim et al. |
| 2019/0276737 A1 | 9/2019 | Won et al. |
| 2019/0280231 A1 | 9/2019 | Kim et al. |
| 2019/0348577 A1 | 11/2019 | Pathak et al. |
| 2019/0348623 A1 | 11/2019 | Dohner et al. |
| 2019/0367810 A1 | 12/2019 | Omata et al. |
| 2019/0378959 A1 | 12/2019 | Won et al. |
| 2019/0390109 A1 * | 12/2019 | Ippen .................. C09K 11/883 |
| 2020/0172802 A1 | 6/2020 | Ahn et al. |
| 2020/0174288 A1 | 6/2020 | Kim et al. |
| 2020/0220043 A1 | 7/2020 | Park et al. |
| 2020/0263083 A1 | 8/2020 | Kim et al. |
| 2020/0291296 A1 | 9/2020 | Mamuye et al. |
| 2020/0332186 A1 | 10/2020 | Kim et al. |
| 2020/0332190 A1 | 10/2020 | Kim et al. |
| 2021/0066634 A1 | 3/2021 | Park et al. |
| 2021/0183999 A1 | 6/2021 | Kwon et al. |
| 2022/0119707 A1 | 4/2022 | Hwang et al. |
| 2022/0204843 A1 | 6/2022 | Jung et al. |
| 2022/0220379 A1 | 7/2022 | Lee et al. |
| 2022/0246804 A1 | 8/2022 | Park et al. |
| 2023/0104847 A1 * | 4/2023 | Kwon .................... G02B 6/005 257/40 |

FOREIGN PATENT DOCUMENTS

| | | |
|---|---|---|
| CN | 103890134 A | 6/2014 |
| CN | 107121454 A | 9/2017 |
| CN | 107663452 A | 2/2018 |
| CN | 107815310 A | 3/2018 |
| CN | 108865109 A | 11/2018 |
| CN | 109244201 A | 1/2019 |
| CN | 109280960 A | 1/2019 |
| CN | 109370564 A | 2/2019 |
| CN | 111234822 A | 6/2020 |
| EP | 3536762 A1 | 9/2019 |
| JP | H02172899 A | 7/1990 |
| JP | 2018115315 A | 7/2018 |

(56) References Cited

FOREIGN PATENT DOCUMENTS

| | | | |
|---|---|---|---|
| KR | 1020070058072 A | 6/2007 | |
| KR | 1020080093539 A | 10/2008 | |
| KR | 100871961 B1 | 12/2008 | |
| KR | 1020090078547 A | 7/2009 | |
| KR | 20110069836 A | 6/2011 | |
| KR | 101165100 B1 | 7/2012 | |
| KR | 1020130044071 A | 5/2013 | |
| KR | 1020140032811 A | 3/2014 | |
| KR | 101460155 B1 | 11/2014 | |
| KR | 1480475 B1 | 1/2015 | |
| KR | 20150034621 A | 4/2015 | |
| KR | 101525524 B1 | 6/2015 | |
| KR | 101585430 B1 | 1/2016 | |
| KR | 20180059363 A | 6/2016 | |
| KR | 1668480 B1 | 10/2016 | |
| KR | 101699540 B1 | 1/2017 | |
| KR | 101702000 B1 | 2/2017 | |
| KR | 1020170049452 A | 5/2017 | |
| KR | 20170072742 A | 6/2017 | |
| KR | 20170074585 A | 6/2017 | |
| KR | 101762728 B1 | 7/2017 | |
| KR | 20170080795 A | 7/2017 | |
| KR | 20180013801 A | 2/2018 | |
| KR | 20180024363 A | 3/2018 | |
| KR | 1020180033758 A | 4/2018 | |
| KR | 20180068893 A | 6/2018 | |
| KR | 1020180068893 A | 6/2018 | |
| KR | 20180076294 A | 7/2018 | |
| KR | 101895229 B1 | 9/2018 | |
| KR | 20190003598 A | 1/2019 | |
| KR | 20190106823 A | 9/2019 | |
| KR | 1020190106819 A | 9/2019 | |

OTHER PUBLICATIONS

Gonzalez et al., "Synthesis and Characterization of Colloidal ZnTe/ZnS and ZnTe/ZnSe Quantum Dots," Honors Thesis Presented to the Department of Physics and Astronomy University of New Mexico. 2019, pp. 1-34, https://physics.unm.edu/pandaweb/undergraduate/programs/honorsThesis/2019_Gonzales.pdf.

Guozhi Jia et al., "Heterostructure tote transformation of ternary ZnTexSe1—x/ZnSe core/shell quantum dots," Digest Journal of Nanomaterilas and Biostructures, Jan.-Mar. 2011, pp. 45-53, vol. 6, No. 1.

Guozhi Jia et al., "Size Effect of Heterostructure Type in Core/Shell Quantum Dot," International Journal of Electrochemical Science, Jun. 1, 2013, pp. 8167-8174, vol. 8.

H Asano et al., "Synthesis of colloidal Zn(Te,Se) alloy quantum dots," Materials Research Express, Oct. 3, 2017, pp. 1-10, vol. 4, Article id. 106501.

Hiroshi Asano et al., "Colloidal Zn(Te,Se)/ZnS Core/Shell Quantum Dots Exhibiting Narrow-Band and Green Photoluminescence," ACS Omega, Jun. 20, 2018, pp. 6703-6709, vol. 3.

Jianhai Zhou et al., "Ideal CdSe/CdS core/shell nanocrystals enabled by entropic ligands and their core size-, shell thickness-, and ligand-dependent photoluminescence properties," Journal of the American Chemical Society, Nov. 2, 2017, pp. 1-33.

Jiwon Bang et al., "ZnTe/ZnSe (Core/Shell) Type-II Quantum Dots: Their Optical and Photovoltaic Properties," Chemistry of Materials, Nov. 23, 2009, pp. 233-240, vol. 22.

Kiran G Sonawane et al., "A case study: Te in ZnSe and Mn-doped ZnSe quantum dots," Nanotechnology, Jun. 27, 2011, pp. 1-7, vol. 22.

M. J. S. P. Brasil et al., "Evolution of the band gap and the dominant radiative recombination center versus the composition for ZnSe1—XTeX alloys grown by molecular beam epitaxy," Applied Physics Letters, Mar. 8, 1991, pp. 2509-2511, vol. 58, No. 22.

Non-Final Office Action dated Jan. 21, 2022 in U.S. Appl. No. 16/851,539.

Non-Final Office Action dated Mar. 21, 2022 in U.S. Appl. No. 16/851,509.

Notice of Allowance dated Oct. 3, 2022 in U.S. Appl. No. 16/851,509.

Notice of Allowance dated Jun. 29, 2022 in U.S. Appl. No. 16/851,539.

Office Action dated Sep. 26, 2022, of the corresponding Chinese Patent Application No. 202010310970.7 (family of co-pending U.S. Appl. No. 16/851,509).

Simon M. Fairclough et al., "Growth and Characterization of Strained and Alloyed Type-II ZnTe/ZnSe Core-Shell Nanocrystals," The journal of Physical chemistry, Nov. 18, 2012, pp. 26898-26907, vol. 116.

Vladimir Lesnyak et al., "Colloidal semiconductor nanocrystals: the aqueous approach," Chem. Soc. Rev, Nov. 201, 2012, pp. 2905-2929, vol. 42.

CN Office Action dated Jun. 13, 2023, of Chinese Patent Application No. 202010311092.0.

CN Office Action dated Jun. 22, 2023, of Chinese Patent Application No. 202010310970.7.

Botao Ji, et al., Heavy-Metal-Free Fluorescent ZnTe/ZnSe Nanodumbbells, ACS Nano, Jun. 27, 2017, pp. 7312-7320, vol. 11.

Office Action dated Apr. 17, 2023, of the corresponding Chinese Patent Application No. 202010307314.1, 8 pp.

Notice of Allowance dated Dec. 27, 2023 of the corresponding Korean Patent Application No. 10-2019-0045759.

Non-Final Office Action dated Dec. 20, 2023 in U.S. Appl. No. 18/070,635.

Non-Final Office Action, Issued Dec. 7, 2023 in U.S. Appl. No. 18/105,911.

U.S. Appl. No. 16/851,509 (U.S. Pat. No. 11,572,504), Zinc Tellurium Selenium Based Quantum Dot.

U.S. Appl. No. 16/851,520 (U.S. Pat. No. 11,739,263), Cadmium Free Quantum Dot Including Lithium, Production Method Thereof, and Electric Device Including the Same.

U.S. Appl. No. 16/851,539 (U.S. Pat. No. 11,525,083), Core Shell Quantum Dot, Production Method Thereof, and Electronic Device Including the Same.

U.S. Appl. No. 18/105,911 (U.S. Pat. No. 12,049,581), Zinc Tellurium Selenium Based Quantum Dot.

U.S. Appl. No. 18/070,635 (U.S. Pat. No. 12,043,780), Core Shell Quantum Dot, Production Method Thereof, and Electronic Device Including the Same.

U.S. Appl. No. 17/072,440 (U.S. Pat. No. 11,603,493), Electroluminescent Device, and Display Device Comprising Thereof.

U.S. Appl. No. 17/072,335 (U.S. Pat. No. 11,693,136), Core Shell Quantum Dot, Production Method Thereof, and Electronic Device Including the Same.

Aqiang Wang et al., "Bright, efficient, and color-stable violet ZnSe-based quantum dot light-emitting diodes," Nanoscale, Jan. 5, 2015, pp. 2951-2959, vol. 7.

Extended European Search Report dated Mar. 9, 2021, of the corresponding European Patent Application No. 20202240.6.

Peter M. Ndangili, et al., Gallium-Induced Perturbation of Zinc Selenide Quantum Dots Electronics, Chemistry Select, vol. 2, No. 24, Aug. 22, 2017, pp. 7054-7062.

T. Maruyama et al., "Compensation centers in ZnSeTe," Journal of Applied Physics, Aug. 26, 1999, pp. 5993-5999, vol. 86, No. 11.

Madimir Lesnyak et al., "One-step aqueous synthesis of blue-emitting glutathione-capped ZnSe1," Communication, Dec. 8, 2009, pp. 886-888, vol. 46.

\* cited by examiner

CADMIUM FREE QUANTUM DOT INCLUDING LITHIUM, PRODUCTION METHOD THEREOF, AND ELECTRONIC DEVICE INCLUDING THE SAME

CROSS-REFERENCE TO RELATED APPLICATIONS

This application is a continuation application of application Ser. No. 16/851,520, filed Apr. 17, 2020, which claims priority to and the benefit of Korean Patent Application No. 10-2019-0045758 filed in the Korean Intellectual Property Office on Apr. 18, 2019, and all the benefits accruing therefrom under U.S.C. § 119, the contents of which in their entirety are herein incorporated by reference.

BACKGROUND

1. Field

A lithium containing cadmium free quantum dot, a production method thereof, and an electronic (or display) device including the same are disclosed.

2. Description of the Related Art

Unlike bulk materials, physical characteristics (e.g., energy bandgaps and melting points) of nanoparticles may be controlled by changing a size thereof. For example, a semiconductor nanocrystal particle (also known as a quantum dot) is a crystalline material having a size of several nanometers. The semiconductor nanocrystal particle has a relatively small size and a large surface area per unit volume and exhibits a quantum confinement effect, and thus may have different properties than bulk materials having the same composition. A quantum dot may absorb light from an excitation source to be excited, and may emit energy corresponding to an energy bandgap of the quantum dot.

SUMMARY

An embodiment provides a cadmium-free quantum dot capable of realizing, e.g., exhibiting, enhanced optical properties (such as luminous efficiency and a FWHM).

An embodiment provides a method of manufacturing the aforementioned quantum dot.

An embodiment provides a quantum dot polymer composite including the aforementioned quantum dots.

An embodiment provides an electronic (or display) device including the aforementioned quantum dot.

In an embodiment, a cadmium free quantum dot includes zinc, tellurium, and selenium, and lithium, wherein a full width at half maximum thereof is less than or equal to about 50 nanometers (nm) and the cadmium free quantum dot (hereinafter also can be referred to simply as quantum dot) has a quantum efficiency of greater than or equal to about 1%.

A maximum luminescent peak of the cadmium free quantum dot may be present in a range of between about 470 nm (e.g., greater than or equal to about 475 nm or greater than or equal to about 479 nm) and a first absorption peak.

An ultraviolet-visible (UV-Vis) absorption spectrum of the quantum dot may not include a valley between a wavelength range of greater than or equal to about 400 nm and less than or equal to about a first absorption peak wavelength.

In the quantum dot, a molar ratio of tellurium with respect to selenium (Te:Se) may be greater than about 0.05:1.

In the quantum dot, a molar ratio of tellurium with respect to selenium (Te:Se) may be greater than or equal to about 0.5:1.

In the quantum dot, a molar ratio of tellurium with respect to selenium (Te:Se) may be greater than or equal to about 0.7:1.

In the quantum dot, a molar ratio of tellurium with respect to selenium (Te:Se) may be greater than or equal to about 1:1.

In the quantum dot, a molar ratio of tellurium with respect to selenium (Te:Se) may be greater than or equal to about 2:1.

In the quantum dot, a molar ratio of tellurium with respect to selenium (Te:Se) may be less than or equal to about 4:1, less than or equal to about 3.5:1, less than or equal to about 3:1, or less than or equal to about 2.7:1.

In the quantum dot, a molar ratio of tellurium with respect to selenium (Te:Se) may be less than or equal to about 2.5:1, less than or equal to about 2.2:1, or less than or equal to about 2.0:1.

The quantum dot may include $ZnTe_xSe_{1-x}$, wherein x is greater than or equal to about 0.5 and less than or equal to about 0.9.

An amount of the lithium may be greater than or equal to about 0.01 moles or greater than or equal to about 0.05 moles with respect to 1 mole of tellurium.

An amount of the lithium may be greater than or equal to about 0.1 moles with respect to 1 mole of tellurium.

An amount of the lithium may be less than or equal to about 0.2 moles with respect to 1 mole of tellurium.

An amount of the lithium may be less than or equal to about 0.5 moles with respect to 1 mole of tellurium. An amount of the lithium may be less than or equal to about 0.4 moles with respect to 1 mole of tellurium.

The quantum dot may have a maximum photoluminescent peak in a wavelength range of less than or equal to about 550 nm.

A full width at half maximum of the maximum (photo) luminescent peak may be less than or equal to about 45 nm, or less than or equal to about 40 nm.

A full width at half maximum (FWHM) of the maximum photoluminescent peak may be less than or equal to about 35 nm.

A full width at half maximum (FWHM) of the maximum photoluminescent peak may be less than or equal to about 30 nm.

A full width at half maximum (FWHM) of the maximum photoluminescent peak may be less than or equal to about 28 nm.

The quantum dot may have quantum efficiency of greater than or equal to about 3%.

The quantum dot may have a core including a first semiconductor nanocrystal and a semiconductor nanocrystal shell disposed on (e.g., a surface of) the core.

The first semiconductor nanocrystal may include $ZnTe_xSe_{1-x}$, wherein x is greater than or equal to about 0.5 and less than or equal to about 0.95, for example, greater than or equal to about 0.5 and less than or equal to about 0.9.

The semiconductor nanocrystal shell may include zinc and at least one of sulfur and selenium (e.g., S, Se, or a combination thereof), e.g., ZnSe, ZnS, ZnSeS.

A FWHM of the maximum photoluminescent peak of the quantum dot may be less than or equal to about 30 nm and a quantum efficiency thereof may be greater than or equal to about 4%.

A FWHM of the maximum photoluminescent peak of the quantum dot may be less than or equal to about 35 nm and a quantum efficiency thereof may be greater than or equal to about 5%.

The first semiconductor nanocrystal or the quantum dot may not include manganese, copper, or a combination thereof.

The quantum dot may not include a Group III-V compound (e.g., a compound including In, Ga, or a combination thereof, such as an indium phosphide).

The (cadmium free) quantum dot may have a Zinc Blende crystalline structure for example as determined by an X-ray diffraction spectroscopy analysis.

The quantum dot may have a size of greater than or equal to about 2 nm.

The quantum dot may have a size of less than or equal to about 20 nm.

The quantum dot may include an organic ligand and the organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RHPO(OH), $RPO(OH)_2$, $R_2POOH$, a polymeric organic ligand, or a combination thereof, wherein R and R' are the same or different and are each independently hydrogen, a substituted or unsubstituted C1 to C40 aliphatic hydrocarbon group, a substituted or unsubstituted C6 to C40 aromatic hydrocarbon group, or a combination thereof.

The organic ligand may not include a poly-functional compound having a thiol moiety and at least one of an amino group, and a carboxylic acid group. The organic ligand may not include glutathione compound.

The (cadmium free) quantum dot may be water-insoluble.

When dispersed in water, the quantum dot may have an average particle size of greater than or equal to about 300 nm as determined by a dynamic light scattering (DLS) analysis.

When being dispersed in an organic solvent (such as toluene, octane, or the like), the quantum dot may be configured to form an organic solution having an average particle size of less than 50 nm, e.g., less than or equal to about 30 nm, or less than or equal to about 20 nm as determined by a DLS analysis.

In an embodiment, a quantum dot includes zinc, tellurium, and selenium, and the quantum dot includes lithium and does not include cadmium, and in the quantum dot, an amount of the lithium with respect to one mole of tellurium may be greater than or equal to about 0.01 moles.

In an embodiment, a production method of the cadmium free quantum dot includes:

preparing a zinc precursor organic solution including a zinc precursor and a first organic ligand in an organic solvent; and while heating the zinc precursor organic solution at a first reaction temperature, adding to the zinc precursor organic solution a selenium precursor, a tellurium precursor, a lithium compound, and a second organic ligand (e.g., at least one or two second organic ligand(s)) (e.g., simultaneously) to produce the cadmium free quantum dot.

The first reaction temperature may be greater than or equal to about 280° C.

The method may further include mixing the selenium precursor, the tellurium precursor, the lithium compound, and the second organic ligand to form a mixed solution at a temperature of less than about 80° C.

The method may further include adding the mixed solution to the zinc precursor organic solution.

The second organic ligand may include an aliphatic organic amine compound or a combination thereof.

The lithium compound may further include hydrogen and optionally boron. The lithium compound may include a lithium hydride, a lithium borohydride, or a combination thereof.

In an embodiment, a quantum dot (e.g., polymer) composite includes a (e.g., polymer) matrix; and a plurality of quantum dots dispersed in the (polymer) matrix, wherein the plurality of quantum dots includes the aforementioned (core-shell) quantum dots.

The polymer matrix may include a cross-linked polymer, a binder polymer including a carboxylic acid group, or a combination thereof.

The cross-linked polymer may include a polymerization product of a photopolymerizable monomer including a carbon-carbon double bond, a polymerization product of the photopolymerizable monomer and a multi-functional thiol compound having at least two thiol groups (e.g., at a terminal end of the multi-functional thiol compound), or a combination thereof.

The quantum dot (-polymer) composite may further include a metal oxide fine particle (e.g., dispersed in the polymer matrix).

In an embodiment, a display device includes a light emitting element (e.g., a photoluminescent element), wherein the light emitting element includes the aforementioned quantum dot-polymer composite. The display device may further include a light source and the light source is configured to provide the light emitting element with incident light.

The incident light may have a photoluminescence peak wavelength of about 440 nm to about 460 nm.

The light emitting element may include a sheet of the quantum dot polymer composite.

The display device may further include a liquid crystal panel, and the sheet of the quantum dot polymer composite may be disposed between the light source and the liquid crystal panel.

The light emitting element may include a stacked structure including a substrate and a light emitting layer (e.g., a photoluminescent layer) disposed on the substrate, wherein the light emitting layer includes a pattern of the quantum dot polymer composite.

The pattern may include a repeating section (e.g., at least one or two repeating section) configured to emit light at a predetermined wavelength.

The display device may be configured to have color reproducibility of greater than or equal to about 80% measured in accordance with a BT2020 standard.

A cadmium-free quantum dot capable of emitting light with an enhanced efficiency and a reduced FWHM at a desired wavelength (e.g., of greater than about 470 nm) may be provided. The quantum dot of an embodiment may be applied to, e.g., used in, various display devices, biolabeling (biosensor, bioimaging), a photodetector, a solar cell, a hybrid composite, or the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
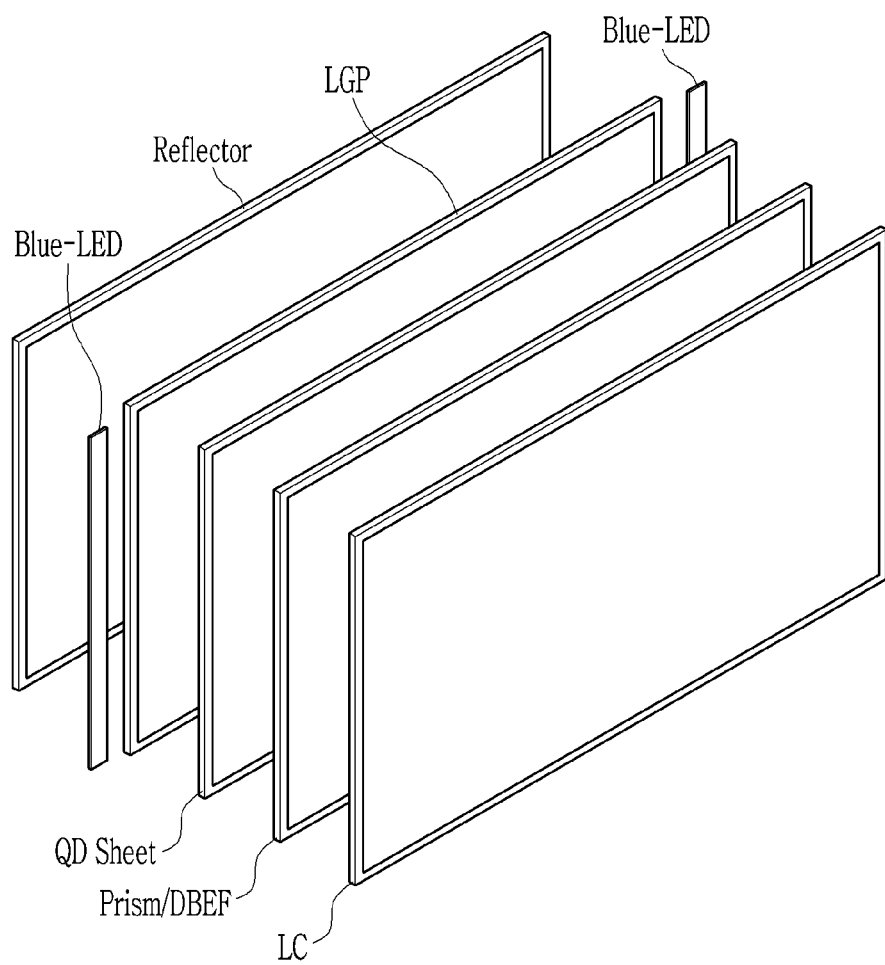
FIG. 1 is an exploded view of a display device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" may refer to replacement of hydrogen of a compound or a group by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO₃H₂) or a salt thereof (—PO₃MH or —PO₃M₂, wherein M is an organic or inorganic cation), or a combination thereof.

As used herein, when a definition is not otherwise provided, a hydrocarbon group refers to a group including (e.g., consisting of) carbon and hydrogen (e.g., an alkyl, alkenyl, alkynyl, or aryl group). The hydrocarbon group may be a group having a valence of one or greater formed by removal of at least one hydrogen atom from alkane, alkene, alkyne, or arene. In the hydrocarbon group, at least one methylene may be replaced by an oxide moiety, a carbonyl moiety, an ester moiety, —NH—, or a combination thereof.

As used herein, when a definition is not otherwise provided, "aliphatic" refers to a saturated or unsaturated linear or branched hydrocarbon group. An aliphatic group may be an alkyl, alkenyl, or alkynyl group, for example.

As used herein, when a definition is not otherwise provided, "alkyl" refers to a linear or branched saturated monovalent hydrocarbon group (methyl, ethyl, hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aromatic" refers to an organic compound or group comprising at least one unsaturated cyclic group having delocalized pi electrons. The term encompasses both hydrocarbon aromatic compounds and heteroaromatic compounds.

As used herein, when a definition is not otherwise provided, "aryl" refers to a group formed by removal of at least one hydrogen from an aromatic hydrocarbon (e.g., a phenyl or naphthyl group).

As used herein, when a definition is not otherwise provided, "hetero" refers to one including one or more (e.g., 1 to 3) heteroatom of N, O, S, Si, P, or a combination thereof.

As used herein, "Group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and TI, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

The quantum efficiency or quantum yield is defined as a ratio of the number of emitted photons divided by the number of absorbed photons. The quantum efficiency or quantum yield may be related to a ratio between photons absorbed and photons emitted through fluorescence. It can be measured in solution or in solid phase. The quantum efficiency or quantum yield can be readily and/or routinely measured using a commercially available measuring equipment (e.g., spectrophotometer) (e.g., Hitachi F-7000 from Hitachi Co., Ltd., a Quantaurus series from Hamamatsu Co. Ltd, a spectrophotometer manufactured by Horiba Co., Ltd.) in accordance with a manual provided by the manufacturer.

The FWHM and the maximum PL peak wavelength may be determined by a photoluminescent spectrum obtained by a photospectrometer (or Fluorescence Spectrophotometer).

Semiconductor nanocrystal particles (e.g., quantum dots) may absorb light from an excitation source and may emit light corresponding to an energy bandgap of the quantum dots. The energy bandgap of the quantum dot may vary with a size and a composition thereof. For example, as the size of the quantum dot increases, the quantum dot may have a narrower energy bandgap and may exhibit an increased light emitting wavelength. Semiconductor nanocrystals may be used as a light emitting material in various fields such as a display device, an energy device, or a bio light emitting device.

Quantum dots having relatively increased photoluminescence properties may include cadmium (Cd). Cadmium may cause environmental issues, health issues, or a combination thereof and is a restricted element defined under Restriction of Hazardous Substances Directive (RoHS) in many countries. Accordingly, there remains a need for development of a cadmium-free quantum dot that may exhibit improved photoluminescence characteristics while being capable of emitting light of a desired wavelength, for example when being applied to, e.g., used in, an electroluminescent or photoluminescent device.

In order to be applied to, e.g., used in, a quantum dot display device (e.g., including a color conversion layer including the quantum dot) and to realize, e.g., provide, a display device having a relatively high (e.g., about 90% or greater) color reproducibility under a next generation color standard such as BT2020, a quantum dot having a relatively narrow full width at half maximum (FWHM) is desired. For example, in order for a device to achieve an enhanced color reproducibility under the BT2020 standard, a luminous material used therein may be desired to have a FWHM of less than or equal to about 50 nm, less than or equal to about 40 nm, or less than or equal to about 30 nm.

A cadmium free quantum dot(s) according to an embodiment (hereinafter, also referred to simply as quantum dot) does not include cadmium. The quantum dot may not include a toxic heavy metal (e.g., lead, mercury, or the like). The quantum dot may include Zn, Te, and Se and further include lithium. A maximum light emitting wavelength of the quantum dot may be present in a range of greater than about 470 nm. The maximum luminescent peak of the quantum dot may have a full width at half maximum that is less than or equal to about 50 nm, less than or equal to about 40 nm, less than or equal to about 35 nm. The quantum dot has a quantum efficiency of greater than or equal to about 1%. The expression that "not including the cadmium (or other heavy metal)" may refer to the case where a concentration of the cadmium (or other heavy metal) may be less than or equal to about 50 ppm, less than or equal to about 10 ppm, or almost zero.

The (cadmium free) quantum dot may have a core-shell structure. The (cadmium free) quantum dot may form a core. The (cadmium free) quantum dot may not include a (semiconductor nanocrystal) shell.

In an embodiment, the cadmium free quantum dot may include a core including a first semiconductor nanocrystal and a semiconductor nanocrystal shell disposed on the core (or at least a portion of a surface of the core).

The cadmium free quantum dot may include a predetermined amount of tellurium. An amount of the tellurium included in the quantum dot may be determined by an appropriate tool (e.g., an inductively coupled plasma atomic emission spectroscopy (ICP-AES), an X-ray photoelectron spectroscopy (XPS), or the like).

In a (cadmium free) quantum dot of an embodiment, a molar ratio of tellurium with respect to selenium (Te:Se) may be greater than about 0.05:1, for example, greater than or equal to about 0.055:1, greater than or equal to about 0.06:1, greater than or equal to about 0.065:1, or greater than or equal to about 0.07:1. In a quantum dot of an embodiment, a molar ratio of tellurium with respect to selenium (Te:Se) may be greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, greater than or equal to about 0.85:1, greater than or equal to about 0.9:1, or greater than or equal to about 0.95:1. In a quantum dot of an embodiment, a molar ratio of tellurium with respect to selenium (Te:Se) may be greater than 1:1. In an embodiment, a molar ratio of tellurium with respect to selenium (Te:Se) may be greater than or equal to about 1.1:1, greater than or equal to about 1.2:1, greater than or equal to about 1.3:1, greater than or equal to about 1.4:1, greater than or equal to about 1.5:1, greater than or equal to about 1.6:1, greater than or equal to about 1.7:1, greater than or equal to about 1.8:1, greater than or equal to about 1.9:1, greater than or equal to about 2:1, greater than or equal to about 2.1:1, or greater than or equal to about 2.2:1.

In a (cadmium free) quantum dot of an embodiment, a molar ratio of tellurium with respect to selenium (Te:Se) may be less than or equal to about 4:1, less than or equal to about 3.9:1, less than or equal to about 3.8:1, less than or equal to about 3.7:1, less than or equal to about 3.6:1, less than or equal to about 3.5:1, less than or equal to about 3.4:1, less than or equal to about 3.3:1, less than or equal to about 3.2:1, less than or equal to about 3.1:1, less than or equal to about 3:1, less than or equal to about 2.9:1, less than or equal to about 2.8:1, less than or equal to about 2.7:1, less than or equal to about 2.6:1, less than or equal to about 2.5:1, less than or equal to about 2.4:1, less than or equal to about 2.3:1, less than or equal to about 2.2:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, or less than or equal to about 1.3:1.

In a (cadmium free) quantum dot of an embodiment, a molar ratio of tellurium with respect to zinc (Te:Zn) may be greater than or equal to about 0.1:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, greater than or equal to about 0.2:1, greater than or equal to about 0.21:1, greater than or equal to about 0.22:1, greater than or equal to about 0.23:1, greater than or equal to about 0.24:1, greater than or equal to about 0.25:1, greater than or equal to about 0.26:1, greater than or equal to about 0.27:1, greater than or equal to about 0.28:1, greater than or equal to about 0.29:1, greater than or equal to about 0.3:1, greater than or equal to about 0.32:1, greater than or equal to about 0.33:1, greater than or equal to about 0.34:1, greater than or equal to about 0.35:1, greater than or equal to about 0.36:1, greater than or equal to about 0.37:1, greater than or equal to about 0.38:1, greater than or equal to about 0.39:1, greater than or equal to about 0.4:1, greater than or equal to about 0.42:1, greater than or equal to about 0.43:1, greater than or equal to about 0.44:1, greater than or equal to about 0.45:1, greater than or equal to about 0.46:1, greater than or equal to about 0.47:1, greater than or equal to about 0.48:1, greater than or equal to about 0.49:1, or greater than or equal to about 0.5:1. In the quantum dot of an embodiment, a molar ratio of tellurium with respect to zinc (Te:Zn) may be (for example, as measured by an inductively coupled plasma atomic emission spectroscopy), may be less than about 1:1, for example, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, less than or equal to about 0.55:1, less than or equal to about 0.5:1, less than or equal to about 0.45:1, less than or equal to about 0.4:1, less than or equal to about 0.35:1, or less than or equal to about 0.3:1.

The cadmium free quantum dot of an embodiment may further include sulfur (e.g., when it has a core-shell structure) and a molar ratio of the sulfur with respect to zinc may be greater than or equal to about 0.1:1 and less than or equal to about 0.6:1.

In an embodiment, the cadmium free quantum dot (or the core of the core-shell quantum dot) may include a first semiconductor nanocrystal including zinc, tellurium, and selenium.

The first semiconductor nanocrystal may include $ZnTe_xSe_{1-x}$ (wherein x is greater than or equal to about 0.5, for example, greater than or equal to about 0.51, greater than or equal to about 0.52, greater than or equal to about 0.53, greater than or equal to about 0.54, greater than or equal to about 0.55, greater than or equal to about 0.56, greater than or equal to about 0.57, greater than or equal to about 0.58, greater than or equal to about 0.59, greater than or equal to about 0.6, greater than or equal to about 0.61, greater than or equal to about 0.62, greater than or equal to about 0.63, greater than or equal to about 0.64, greater than or equal to about 0.65, greater than or equal to about 0.66, greater than or equal to about 0.67, greater than or equal to about 0.68, greater than or equal to about 0.69, greater than or equal to about 0.70, greater than or equal to about 0.71, greater than or equal to about 0.72, greater than or equal to about 0.73, greater than or equal to about 0.74, or greater than or equal to about 0.75 and less than or equal to about 0.95, less than or equal to about 0.9, less than or equal to about 0.89, less than or equal to about 0.88, less than or equal to about 0.87, less than or equal to about 0.86, less than or equal to about 0.85, less than or equal to about 0.84, less than or equal to about 0.83, less than or equal to about 0.82, or less than or equal to about 0.8).

In the first semiconductor nanocrystal, an amount of tellurium may be greater than that of selenium. In an embodiment, in the core or the first semiconductor nanocrystal, a molar ratio of selenium with respect to tellurium (Se:Te) may be greater than or equal to about 0.3:1, greater than or equal to about 0.4:1, greater than or equal to about 0.5:1, or greater than or equal to about 0.55:1 and less than or equal to about 0.9:1, less than or equal to about 0.8:1, or less than or equal to about 0.7:1.

The cadmium free quantum dot of an embodiment includes lithium. When the cadmium free quantum dot of an embodiment has a core-shell structure, the lithium may be included in the core. When the cadmium free quantum dot of an embodiment has a core-shell structure, a semiconductor nanocrystal shell may not include lithium.

In a (cadmium free) quantum dot of an embodiment, a molar ratio of lithium with respect to tellurium may be greater than or equal to about 0.01:1, for example, greater than or equal to about 0.02:1, greater than or equal to about 0.03:1, greater than or equal to about 0.04:1, greater than or equal to about 0.05:1, greater than or equal to about 0.06:1, greater than or equal to about 0.07:1, greater than or equal to about 0.08:1, greater than or equal to about 0.09:1, greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.16:1, greater than or equal to about 0.17:1, greater than or equal to about 0.18:1, greater than or equal to about 0.19:1, greater than or equal to about 0.2:1, greater than or equal to about 0.21:1, greater than or equal to about 0.22:1, greater than or equal to about 0.23:1, greater than or equal to about 0.24:1, greater than or equal to about 0.25:1, greater than or equal to about 0.26:1, greater than or equal to about 0.27:1, greater than or equal to about 0.28:1, greater than or equal to about 0.29:1, greater than or equal to about 0.3:1, greater than or equal to about 0.31:1, greater than or equal to about 0.32:1, greater than or equal to about 0.33:1, greater than or equal to about 0.34:1, greater than or equal to about 0.35:1, greater than or equal to about 0.36:1, greater than or equal to about 0.37:1, greater than or equal to about 0.38:1, greater than or equal to about 0.39:1, greater than or equal to about 0.4:1, greater than or equal to about 0.41:1, greater than or equal to about 0.42:1, greater than or equal to about 0.43:1, greater than or equal to about 0.44:1, greater than or equal to about 0.45:1, greater than or equal to about 0.46:1, greater than or equal to about 0.47:1, greater than or equal to about 0.48:1, greater than or equal to about 0.49:1, or greater than or equal to about 0.50:1.

In the quantum dot, the core, or the first semiconductor nanocrystal, a molar ratio of the lithium with respect to tellurium may be less than about 1:1, for example, less than or equal to about 0.9:1, less than or equal to about 0.85:1, less than or equal to about 0.8:1, less than or equal to about 0.75:1, less than or equal to about 0.7:1, less than or equal to about 0.65:1, less than or equal to about 0.6:1, or less than or equal to about 0.55:1.

In a quantum dot of an embodiment, the semiconductor nanocrystal shell includes zinc (Zn), and at least one of selenium (Se) and sulfur (S). The semiconductor nanocrystal shell may include, e.g., be, ZnSe, ZnS, ZnSeS, or a combination thereof.

The semiconductor nanocrystal shell may be a multi-layered shell including a plurality of layers. In the plurality of layers for the shell, adjacent layers may have semiconductor nanocrystal material of different compositions. The multi-layered shell may include a first layer disposed directly on the core and a second layer disposed on or over the first layer. The first layer may include a second semiconductor nanocrystal. The second layer may include a third semiconductor nanocrystal having a composition different from the second semiconductor nanocrystal. The second layer may be the outermost layer of the quantum dot. The second semiconductor nanocrystal may include zinc, selenium, and optionally sulfur. The second semiconductor nanocrystal may not include sulfur. The third semiconductor nanocrystal may include zinc and sulfur. The third semiconductor nanocrystal may not include selenium.

In a multi-layered shell, a thickness of each layer may be selected appropriately. The thickness of the layer may be greater than or equal to about 1 monolayer (ML), for example, greater than or equal to about 2 ML, greater than or equal to about 3 ML, greater than or equal to about 4 ML, greater than or equal to about 5 ML and less than or equal to about 10 ML, for example, less than or equal to about 9 ML, less than or equal to about 8 ML, less than or equal to about 7 ML, less than or equal to about 6 ML, or less than or equal to about 5 ML. The thickness of each layer in the multi-layered shell may be selected taking into consideration a desired composition of a final quantum dot.

In an embodiment, the quantum dot may include a ZnSe layer, a ZnSeS layer, a ZnS layer, or a combination thereof, each of which may be disposed directly on the core. An outermost layer of the quantum dot may include (or consist of) ZnS.

In the shell or the multi-layered shell, each of the layers may include a gradient alloy having a composition varying in a direction of a radius, e.g., a radial direction from the core toward an outermost surface of the quantum dot. In an embodiment, an amount of the sulfur in the semiconductor nanocrystal shell may increase toward a surface of the quantum dot. For example, in the shell, the amount of the sulfur may increase in a direction away from the core, e.g., in a radial direction from the core toward an outermost surface of the quantum dot.

The quantum dot may include any suitable shape. The shape of the quantum dot may include a spherical shape, a polygonal shape, a multipod shape, or a combination thereof. The (cadmium free) quantum dot may show a cubic Zinc Blende crystalline structure for example when analyzed by an X-ray diffraction. Diffraction peaks of the (cadmium free) quantum dot may be indexed to the cubic structure in agreement with the Joint Committee on Powder Diffraction Standard cards.

The cadmium free quantum dot(s) (or a population thereof) may have a particle (average) size of greater than or equal to about 2 nm, greater than or equal to about 3 nm, greater than or equal to about 4 nm, greater than or equal to about 5 nm, greater than or equal to about 6 nm, greater than or equal to about 7 nm, or greater than or equal to about 8 nm. A size (or an average size) of the quantum dot (or a population thereof) may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, or less than or equal to about 10 nm. As used herein, the size of the quantum dot may refer to a diameter or an equivalent diameter obtained from a two-dimensional image of an electron microscopy analysis (e.g., under an assumption of a circle).

A size (or an average size) of the core(s) may be greater than or equal to about 1 nm, for example, greater than or equal to about 2 nm, greater than or equal to about 3 nm or greater than or equal to about 3.5 nm. A size (or an average size) of the core(s) may be less than or equal to about 5 nm, for example, less than or equal to about 4 nm.

The quantum dot(s) may constitute a population of quantum dots. The aforementioned population of the quantum dots may have a standard deviation of their sizes that is less than or equal to about 15%, for example, less than or equal to about 14%, less than or equal to about 13%, less than or equal to about 12%, or less than or equal to about 11%.

The quantum dots according to an embodiment are based on a composition of Zn, Te, and Se while having the aforementioned features, and may have a relatively wide bandgap and a relatively small Bohr radius, e.g., compared to a cadmium based quantum dot or a Group III-V compound (e.g., InP) based quantum dot. Without wishing to be bound by any theory, in the case of the cadmium free quantum dot of an embodiment, it is believed that a variable breadth of a bandgap of a quantum dot of an embodiment versus a change in a size thereof can be relatively smaller than those of a cadmium based quantum dot and a Group III-V compound (e.g., InP) based quantum dot. Thus, it is believed that in the case of the cadmium free quantum dot of an embodiment, a size range enabling the quantum dot to have a green light emitting bandgap can be wider than size ranges enabling a cadmium based quantum dot and a Group III-V compound (e.g., InP) based quantum dot to have a green light emitting bandgap, and a cadmium free quantum dot of an embodiment may have a narrower FWHM than a cadmium based quantum dot or a Group III-V compound (e.g., InP) based quantum dot. Therefore, the cadmium free quantum dots of an embodiment may realize, e.g., exhibit, an improved color reproducibility when the cadmium free quantum dots are applied, e.g., used, in a quantum dot-based display device. It is believed that when green- and red-light emitting quantum dots having a FWHM of about 25 nm are applied to, e.g., used in, a display device, for a backlight with no color filter, a color gamut under a BT2020 standard may be greater than or equal to about 80%, for example, greater than or equal to about 85%, or greater than or equal to about 93%.

The cadmium free quantum dots of an embodiment may emit light of a desired wavelength range at an enhanced efficiency and a narrower FWHM.

In an UV-Vis absorption spectrum, the quantum dots of an embodiment may not have a valley that is adjacent to a first absorption peak or is present within a range of from about 440 nm (or 440 nm, 430 nm, 420 nm, 410 nm, or 400 nm) to a wavelength of the first absorption peak. As used herein, the term "the valley" of the UV-Vis absorption spectrum refers to a portion where a slope of a tangent line of a UV-Vis absorption spectrum curve changes from a negative value to a positive value, as a wavelength increases. As used herein, the term "first absorption peak wavelength" refers to a wavelength of a main excitonic peak appearing first from the longest wavelength region of a UV-vis absorption spectrum of a quantum dot (i.e., appearing in the lowest energy region in the UV-Vis absorption spectrum).

The quantum dots of an embodiment may have a relatively enhanced quantum efficiency in comparison with other conventional Zn, Te, Se based quantum dots (for example, greater than 1%, 2%, or greater than or equal to about 3%). The quantum dots of an embodiment may emit light with a quantum efficiency of greater than or equal to about 6%, greater than or equal to about 7%, greater than or equal to about 8%, greater than or equal to about 9%, greater than or equal to about 10%, greater than or equal to about 11%, greater than or equal to about 12%, greater than or equal to about 13%, greater than or equal to about 14%, greater than or equal to about 15%, greater than or equal to about 16%, greater than or equal to about 17%, greater than or equal to about 18%, greater than or equal to about 19%, or greater than or equal to about 20%.

The quantum dots may have a maximum photoluminescent peak in a wavelength range of greater than about 470 nm, for example, greater than or equal to about 471 nm, greater than or equal to about 472 nm, greater than or equal to about 473 nm, greater than or equal to about 474 nm, greater than or equal to about 475 nm, greater than or equal to about 476 nm, greater than or equal to about 477 nm, greater than or equal to about 478 nm, greater than or equal to about 479 nm, greater than or equal to about 480 nm, greater than or equal to about 485 nm, greater than or equal to about 490 nm, greater than or equal to about 495 nm, greater than or equal to about 500 nm, greater than or equal to about 505 nm, greater than or equal to about 510 nm, greater than or equal to about 515 nm, or greater than or equal to about 520 nm. The quantum dots may have a maximum photoluminescent peak in a wavelength range of less than or equal to about 560 nm, less than or equal to about 550 nm, less than or equal to about 540 nm, or less than or equal to about 535 nm. The quantum dots of an embodiment may emit green light. The green light may have a (PL peak) wavelength of about 515 nm to about 535 nm.

The quantum dots of an embodiment may have a full width at a half maximum of less than or equal to about 35 nm, less than or equal to about 34 10 nm, less than or equal to about 33 nm, less than or equal to about 32 nm, less than or equal to about 31 nm, less than or equal to about 30 nm, less than or equal to about 29 nm, less than or equal to about 28 nm, less than or equal to about 27 nm, less than or equal to about 26 nm, or less than or equal to about 25 nm.

The quantum dot may include an organic ligand e.g., on a surface thereof. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, RHPOOH, a polymeric organic ligand, or a combination thereof wherein R and R' are the same or different, and are independently a C1 to C40 (e.g., C3 to C30 or C6 to C24) substituted or unsubstituted aliphatic hydrocarbon (alkyl, alkenyl, or alkynyl) group or a C6 to C40 substituted or unsubstituted aromatic hydrocarbon group, or a combination thereof. The organic ligand may be used alone or as a mixture of at least two compounds.

The organic ligand may coordinate to, e.g., be bound to, the surface of the quantum dot and help the nanocrystal to be well dispersed in the solution. Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO)); diphenyl phosphine, diphenyl phosphine oxide, triphenyl phosphine, triphenyl phosphine oxide; a mono- or di(C5 to C20 alkyl)phosphinic acid such as mono- or di(hexyl) phosphinic acid, mono- or dioctylphosphinic acid, mono- or di(dodecyl)phosphinic acid, mono- or di(tetradecyl)phosphinic acid, mono- or di(hexadecyl)phosphinic acid, mono- or di(octadecyl)phosphinic acid, or a combination thereof; a C5 to C20 alkylphosphinic acid, a C5 to C20 alkylphosphonic acid such as hexylphosphonic acid, octylphosphonic acid, dodecylphosphonic acid, tetradecylphosphonic acid, hexadecylphosphonic acid, octadecylphosphonic acid, or a combination thereof; and the like, but are not limited thereto. Two or more different organic ligand compounds may be used. In an embodiment, the organic ligand compound may be a combination of RCOOH and an amine (e.g., $RNH_2$, $R_2NH$, $R_3N$, or a combination thereof). In an embodiment, the organic ligand may not include an organic compound having a thiol moiety and an amino group, a carboxylic acid group, or a combination thereof. For example, the organic ligand may not include glutathione compound.

The quantum dot may be water-insoluble.

When dispersed in water, the quantum dot may have an average particle size of greater than or equal to about 300 nm as determined by a dynamic light scattering (DLS) analysis. When being dispersed in an organic solvent (such as toluene, octane, or the like), the quantum dot may be configured to form an organic solution having an average particle size of less than 50 nm, e.g., less than or equal to about 30 nm, or less than or equal to about 20 nm as determined by a DLS analysis.

In an embodiment, a production method of the cadmium free quantum dot includes:

preparing a zinc precursor organic solution including a zinc precursor and a first organic ligand in an organic solvent; while heating the zinc precursor organic solution at a first reaction temperature, adding thereto a selenium precursor, a tellurium precursor, a lithium compound, and a, e.g., at least one, second organic ligand at the same time to synthesize the cadmium free quantum dot (e.g., as a core for a core-shell type quantum dot).

The foregoing method may further include:

in an organic solvent, in the presence of the core and an organic ligand, reacting a zinc precursor and a, e.g., at least one, non-metal precursor of a selenium precursor or a sulfur precursor at a shell formation temperature (e.g., in a plurality of steps) to form a semiconductor nanocrystal shell including zinc, selenium, and sulfur on a surface of the core.

Details for the cadmium free quantum dot and the core are the same as set forth above.

The cadmium free quantum dots or the cores as synthesized may be removed (separated) from a reaction system (e.g., via addition of a non-solvent). Separation using the non-solvent will be described in detail below.

In an embodiment, prior to being added to the zinc precursor organic solution, the selenium precursor, the tellurium precursor, the lithium compound, and the second organic ligand may be mixed at a temperature of less than about 80° C., for example, less than or equal to about 75° C., less than or equal to about 70° C., less than or equal to about 65° C., less than or equal to about 60° C., less than or equal to about 55° C., less than or equal to about 50° C., less than or equal to about 45° C., less than or equal to about 40° C., less than or equal to about 35° C., or less than or equal to about 30° C. to form a single stock solution.

The method may include adding the single stock solution into the zinc precursor organic solution. The second organic ligand may be an aliphatic organic amine compound or a combination thereof. The lithium compound may further include hydrogen, and optionally boron. The lithium compound may include a lithium hydride, a lithium borohydride (e.g., lithium trialkylborohydride), or a combination thereof.

In an embodiment, formation of the shell may be carried out by heating (or vacuum treating) a shell metal precursor and an organic ligand in an organic solvent at a predetermined temperature (e.g., at a temperature of greater than or equal to about 100° C., for example, greater than or equal to about 120° C.), changing an atmosphere of a reaction system into an inert gas and heating the same at a predetermined reaction temperature. The core and a non-metal shell precursor (e.g., sulfur and selenium precursors) are added into the (heated) reaction system to carry out a reaction therebetween. The shell precursor(s) may be injected at the same time or sequentially during the reaction taking into consideration a desired shell composition.

The shell has a gradient composition or a multi-layered composition.

In an embodiment, a zinc precursor may be reacted with a selenium precursor to form a first layer including zinc and selenium and then reacted with a sulfur precursor to form a second layer including zinc and sulfur. The semiconductor nanocrystal shell formation may include reacting the zinc precursor and the selenium precursor. The semiconductor nanocrystal shell formation may include reacting the zinc precursor and the sulfur precursor. The semiconductor nanocrystal shell formation may include reacting the zinc precursor with the selenium precursor and then reacting the zinc precursor with the sulfur precursor.

In the foregoing method, the zinc precursor may include a Zn powder, ZnO, an alkylated Zn compound (e.g., C2 to C30 alkyl (e.g., dialkyl) zinc such as dimethyl zinc, diethyl zinc), a Zn alkoxide (e.g., a zinc ethoxide), a Zn carboxylate (e.g., a zinc acetate or zinc aliphatic carboxylate, for example, zinc long chain aliphatic carboxylate such as zinc oleate), a Zn nitrate, a Zn perchlorate, a Zn sulfate, a Zn acetylacetonate, a Zn halide (e.g., a zinc chloride), a Zn cyanide, a Zn hydroxide, zinc carbonate, zinc peroxide, or a combination thereof. Examples of the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), tellurium-diphenylphosphine (Te-DPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), bistrimethylsilyl sulfide, ammonium sulfide, sodium sulfide, or a combination thereof.

The organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a phosphine oxide (e.g., trioctylphosphine oxide) substituted with at least one (e.g., 1, 2, or 3) C6 to C22 alkyl group, a C12 to C22 aromatic ether such as a phenyl ether or a benzyl ether, or a combination thereof.

The first organic ligand and the second organic ligand may be the same. The first organic ligand and the second organic ligand may be different. Details for the first and the second organic ligands are the same as set forth above about the organic ligand. In an embodiment, the first organic ligand may include a fatty acid (e.g., including a C5 or greater or C10 or greater aliphatic hydrocarbon group) and the second organic ligand may include a fatty organic (e.g., primary) amine (e.g., including one C5 or greater or C10 or greater aliphatic or aromatic hydrocarbon group), an aromatic phosphine compound, or a combination thereof. The carbon number of the aliphatic hydrocarbon group may be greater than or equal to about 5, greater than or equal to about 10, greater than or equal to about 15, greater than or equal to about 16, greater than or equal to about 17, greater than or equal to about 18, greater than or equal to about 19, or greater than or equal to about 20; and/or less than or equal to about 50, less than or equal to about 40, or less than or equal to about 30.

Amounts of the first organic ligand and the second organic ligand may be selected taking into consideration types of the organic ligands and types of the precursors. An amount of the first organic ligand (or an amount of the second ligand) may be, with respect to 1 mole of the zinc precursor, greater than or equal to about 0.1 moles, greater than or equal to about 0.2 moles, greater than or equal to about 0.3 moles, greater than or equal to about 0.4 moles, greater than or equal to about 0.5 moles, greater than or equal to about 0.6 moles, greater than or equal to about 0.7 moles, greater than or equal to about 0.8 moles, greater than or equal to about 0.9 moles, greater than or equal to about 1 moles, greater than or equal to about 2 moles, greater than or equal to about 3 moles, greater than or equal to about 4 moles, or greater than or equal to about 5 moles. An amount of the first organic ligand (or an amount of the second ligand) may be, with respect to 1 mole of the zinc precursor, less than or equal to about 20 moles, less than or equal to about 19 moles, less than or equal to about 18 moles, less than or equal to about 17 moles, less than or equal to about 16 moles, less than or equal to about 15 moles, less than or equal to about 14 moles, less than or equal to about 13 moles, less than or equal to about 12 moles, less than or equal to about 10 moles, less than or equal to about 9 moles, less than or equal to about 8 moles, less than or equal to about 7 moles, less than or equal to about 6 moles, less than or equal to about 5 moles, less than or equal to about 4 moles, less than or equal to about 3 moles, less than or equal to about 2 moles, or less than or equal to about 1 mole.

A molar ratio between the first organic ligand and the second organic ligand (the first organic ligand:the second organic ligand) may be 1:about 0.1 or greater, 1:about 0.5 or greater, 1:about 0.9 or greater, or 1:about 1 or greater, and/or 1:about 10 or less; 1:about 5 or less, 1:about 2.5 or less, or 1:about 1.5 or less.

The lithium compound may be an organic compound having lithium, carbon, and hydrogen, an inorganic compound having lithium, hydrogen, and optionally boron, or a combination thereof. In an embodiment, the lithium compound may further include boron. The lithium compound may include a lithium hydride compound. In an embodiment, the lithium compound may include an alkyl lithium hydride (e.g., dialkyl lithium borohydride, trialkyl lithium borohydride such as lithium triethyl borohydride, or a combination thereof).

In an embodiment, the selenium precursor, the tellurium precursor, the lithium compound may be added (e.g., injected) into the zinc precursor organic solution optionally together with the organic ligand. In an embodiment, the selenium precursor, the tellurium precursor, and the lithium compound may be injected into the zinc precursor organic solution sequentially.

The first reaction temperature (e.g., for the core formation) may be greater than or equal to about 250° C., greater than or equal to about 260° C., greater than or equal to about 270° C., greater than or equal to about 280° C., greater than or equal to about 290° C., or greater than or equal to about 300° C. The first reaction temperature may be less than or equal to about 350° C., for example, less than or equal to about 340° C., less than or equal to about 330° C., less than or equal to about 320° C., or less than or equal to about 310° C. The reaction time for the core formation is not particularly limited and may be selected appropriately.

The reaction temperature for the shell formation may be selected appropriately in any suitable range of greater than or equal to about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., or greater than or equal to about 290° C. and less than or equal to about 340° C., for example, less than or equal to about 325° C. The reaction time for the shell formation may be selected appropriately in light of a desired shell composition.

In a reaction system for the core formation and a reaction system for the shell formation, an amount of each precursor and a concentration thereof may be selected taking into consideration a desired composition of the core and the shell, a reactivity between the core and shell precursors, or the like. In an embodiment, taking into consideration a desired composition of a final quantum dot (e.g., a ratio between elements such as Zn, S, Se, Te, or a combination thereof), ratios between the precursors may be controlled. The composition of the final quantum dot may be determined by an appropriate analysis tool such as an inductively coupled plasma atomic emission spectroscopy.

After the formation of the core, the shell, or a combination thereof, a non-solvent may be added to reaction products and the nanocrystal particles coordinated with, e.g., bound to, the ligand compound may be separated. The non-solvent may be a polar solvent that is miscible with the solvent used in the core formation, shell formation, or a combination thereof and may not be capable of dispersing the produced nanocrystals therein. The non-solvent may be selected taking into consideration the solvent used in the reaction and may be for example acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing non-solvents, or a combination thereof. Separation of the nanocrystal particles may involve centrifugation, sedimentation, chromatography, or distillation. The separated nanocrystal particles may be added to a washing (or dispersing) solvent and washed (or dispersed), if desired. Types of the washing (dispersing) solvent are not particularly limited and a solvent having similar solubility parameter to that of the ligand may be used and examples thereof may include hexane, heptane, octane, chloroform, toluene, benzene, or the like.

In an embodiment, a composition includes the aforementioned (e.g., a plurality of) (cadmium free) quantum dot(s) (hereinafter, may be referred to simply as quantum dot or quantum dots); and a dispersing agent (e.g., a binder monomer or polymer); a polymerizable monomer having a, e.g., at least one, carbon-carbon double bond; a (photo) initiator; or a combination thereof. The composition may further include an organic solvent, a liquid vehicle, or a combination thereof. The binder monomer or polymer may include a carboxylic acid group.

The composition according to an embodiment may be prepared by a method including: preparing quantum dot dispersion including the aforementioned quantum dot, the dispersing agent, and the organic solvent; and mixing the quantum dot dispersion with the initiator; the polymerizable monomer (e.g., acryl-based monomer); optionally the thiol compound; optionally the metal oxide particulate, and optionally the additives. Each of the aforementioned components may be mixed sequentially or simultaneously, but mixing orders are not particularly limited.

The composition thus prepared may provide a quantum dot-polymer composite via a (e.g., radical) polymerization. Thus, in an embodiment, a quantum dot-polymer composite includes a polymer matrix; and the aforementioned quantum dot(s) dispersed in the polymer matrix. The polymer matrix may include a dispersing agent (e.g., a binder monomer or polymer including a carboxylic acid group), a polymerization product (e.g., an insulating polymer) of an ene compound, i.e., a polymerizable monomer having a carbon-carbon double bond (at least one, for example, at least two, at least three, at least four, or at least five carbon-carbon double bonds), optionally a polymerization product of the polymerizable monomer and a thiol compound including at least one thiol group (e.g., at a terminal end of the thiol compound), preferably a multi-functional thiol compound including at least two thiol groups (e.g., at a terminal end of the multi-functional thiol compound), a metal oxide particulate(s), or a combination thereof.

In an embodiment, the polymer matrix may include a cross-linked polymer and a dispersing agent (e.g., a carboxylic acid group-containing binder polymer). In an embodiment, the polymer matrix does not include a conjugated polymer (except for a cardo resin). The cross-linked polymer may include a thiolene resin, a cross-linked poly(meth)acrylate, or a combination thereof. In an embodiment, the cross-linked polymer may be a polymerization product of the ene compound (the polymerizable monomer) and, optionally, the multi-functional thiol compound.

An amount of the quantum dot(s) in the composition (or the composite) may be appropriately adjusted taking into consideration a desirable final use (e.g., a photoluminescent color filter, etc.). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total solids content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total solids content of the composition.

The composition according to an embodiment may be used to produce a quantum dot-polymer composite pattern. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing).

In the composition or the composite according to an embodiment, a dispersing agent may ensure dispersion of the quantum dot(s). In an embodiment, the dispersing agent may be a binder monomer or polymer. The binder monomer or polymer may include a carboxylic acid group.

The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or a combination thereof.

The copolymer includes a first repeating unit derived from the first monomer and a second repeating unit derived from the second monomer, and optionally a third repeating unit derived from the third monomer.

Examples of the first monomer may include carbonic acid (i.e., carboxylic acid) vinyl ester compounds such as acrylic acid, methacrylic acid, maleic acid, itaconic acid, fumaric acid, or 3-butenoic acid, but are not limited thereto. One or more first monomers may be used. Examples of the second monomer may be an alkenyl aromatic compound such as styrene, alpha-methyl styrene, vinyl toluene, vinyl benzoate, or vinyl benzyl methyl ether; an unsaturated carbonic acid ester compound such as vinyl acetate, methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; an unsaturated carbonic acid amino alkyl ester compound such as 2-amino ethyl acrylate, 2-amino ethyl methacrylate, 2-dimethyl amino ethyl acrylate, or 2-dimethyl amino ethyl methacrylate; a maleimide such as N-phenylmaleimide, N-benzylmaleimide, N-alkylmaleimide; an unsaturated carbonic acid glycidyl ester compound such as glycidyl acrylate or glycidyl methacrylate; a vinyl cyanide compound such as acrylonitrile, methacrylonitrile; or a unsaturated amide compound such as acryl amide or methacryl amide, but are not limited thereto. One or more second monomers may be used. Specific examples of the third monomer may include 2-hydroxy ethyl acrylate, 2-hydroxy ethyl methacrylate, 2-hydroxy butyl acrylate, or 2-hydroxy butyl methacrylate, but are not limited thereto. One or more third monomers may be used.

In the carboxylic acid group-containing polymer (also referred to as a binder or a binder polymer), the content of each of the first repeating unit or the second repeating unit may independently be greater than or equal to about 10 mole percent (mol %), for example, greater than or equal to about 15 mol %, greater than or equal to about 25 mol %, or greater than or equal to about 35 mol %, based on a total number of moles in the carboxylic acid group containing polymer. In the carboxylic acid group containing polymer, an amount of the first repeating unit or the second repeating unit may be less than or equal to about 90 mol %, for example, 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %, based on a total number of moles in the carboxylic acid group-containing polymer. In the carboxylic acid group containing polymer, if present, an amount of the third repeating unit may be greater than or equal to about 1 mol %, for example, greater than or equal to about 5 mol %, greater than or equal to about 10 mol %, or greater than or equal to about 15 mol %, based on a total number of moles in the carboxylic acid group containing polymer. In the binder polymer, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %, based on a total number of moles in the binder polymer.

The carboxylic acid group-containing polymer may include a multiple aromatic ring-containing polymer. The multiple aromatic ring-containing polymer is known as a cardo binder resin and may commercially available.

The carboxylic acid group-containing polymer may have an acid value of greater than or equal to about 50 milligrams of potassium hydroxide per gram (mg KOH/g). For example, the carboxylic acid group containing polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the carboxylic acid group-containing polymer may be for example less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto. The binder polymer may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a weight average molecular weight of less than or equal to about 100,000 g/mol, for example less than or equal to about 50,000 g/mol.

In the composition, an amount of the dispersing agent or the binder (polymer or monomer) may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight of the composition, but is not limited thereto. The amount of the binder polymer may be less than or equal to about 55 wt %, less than or equal to about 45 wt %, less than or equal to about 35 wt %, for example less than or equal to about 33 wt %, or less than or equal to about 30 wt %, based on a total weight of the composition or on a total weight of solids in the composition. The aforementioned amount of the dispersing agent may provide enhanced dispersibility of the quantum dots.

In the composition, the polymerizable (e.g., photopolymerizable) monomer including the carbon-carbon double bond may include a (e.g., photopolymerizable) acryl-based monomer, i.e., a monomer containing an acryl group. The polymerizable monomer may be a precursor for an insulating polymer. The acryl-based monomer may include alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A di(meth)acrylate, bisphenol A epoxy (meth)acrylate, tri methylolpropane tri(meth)acrylate, ethylene glycolmonomethylether (meth)acrylate, novolac epoxy (meth)acrylate, dipropylene glycol di(meth)acrylate, tripropylene glycol di(meth)acrylate, propylene glycol di(meth)acrylate, tris(meth)acryloyloxyethyl phosphate, or a combination thereof.

An amount of the polymerizable monomer may be greater than or equal to about 0.5 wt %, for example, greater than or equal to about 1 wt % or greater than or equal to about 2 wt %, based on a total weight of the composition. The amount of the photopolymerizable monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The initiator in the composition may be used for polymerization of the monomers. The initiator is a compound accelerating a radical reaction (e.g., radical polymerization of monomer) by producing radical chemical species under a mild condition (e.g., by heat or light). The initiator may be a thermal initiator or a photoinitiator. The initiator is a compound capable of initiating a radical polymerization of the polymerizable acrylic monomer, a thiol compound (which will be described below), or a combination thereof by light. The initiator is not particularly limited. The initiator may be a thermal initiator. The thermal initiator may include azobisisobutyronitrile, benzoyl peroxide, and the like, but is not limited thereto. The initiator may be a photoinitiator. The photoinitiator may include a triazine-based compound, an acetophenone compound, a benzophenone compound, a thioxanthone compound, a benzoin compound, an oxime ester compound, an aminoketone compound, a phosphine or phosphine oxide compound, a carbazole-based compound, a diketone compound, a sulfonium borate-based compound, a diazo-based compound, a biimidazole-based compound, or a combination thereof, but is not limited thereto.

In the composition, an amount of the initiator may be appropriately adjusted taking into consideration the polymerizable monomers and amounts of the polymerizable monomers. In an embodiment, the initiator may be used in an amount range of about 0.01 wt % to about 10 wt %, based on a total weight of the composition, but is not limited thereto.

The composition or the composite may further include a (multi- or mono-functional) thiol compound including at least one (e.g., at least two, three, or four) thiol group(s) (for example, at a terminal end of the (multi- or mono-functional) thiol compound), a metal oxide particulate, or a combination thereof.

The metal oxide particulate may include $TiO_2$, $SiO_2$, $BaTiO_3$, $Ba_2TiO_4$, ZnO, or a combination thereof. In the composition, an amount of the metal oxide particulate may be greater than or equal to about 1 wt % and less than or equal to about 15 wt %, less than or equal to about 10 wt %, or less than or equal to about 5 wt %, based on a total weight of solids in the composition. The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1,000 nm or less than or equal to about 800 nm.

The multi-functional thiol compound may include a compound represented by Chemical Formula 1:

Chemical Formula 1

wherein, in Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are independently hydrogen or a C1 to C30 linear or branched alkyl group provided that both are not simultaneously hydrogen); an isocyanate group; a halogen; —ROR' (wherein R is a substituted or unsubstituted C1 to C20 alkylene group and R' is hydrogen or a C1 to C20 linear or branched alkyl group); an acyl halide (—RC(=O)X, wherein R is a substituted or unsubstituted C1 to C20 alkylene group and X is a halogen); —C(=O)OR' (wherein R' is hydrogen or a C1 to C20 linear or branched alkyl group); —CN; —C(=O)NRR' (wherein R and R' are independently hydrogen or a C1 to C20 linear or branched alkyl group); or —C(=O)ONRR' (wherein R and R' are independently hydrogen or a C1 to C20 linear or branched alkyl group), $L_1$ is a carbon atom, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heterocycloalkylene group, or a substituted or unsubstituted C3 to C30 heteroarylene group, wherein a methylene moiety (—$CH_2$—) of the substituted or unsubstituted C1 to C30 alkylene group may be replaced by a sulfonyl moiety (—$SO_2$—), a carbonyl moiety (CO), an ether moiety (—O—), a sulfide moiety (—S—), a sulfoxide moiety (—SO—), an ester moiety (—C(=O)O—), an amide moiety (—C(=O)NR—) (wherein R is hydrogen or a C1 to C10 alkyl group) or a combination thereof, $Y_1$ is a single bond; a substituted or unsubstituted C1 to C30 alkylene group; a substituted or unsubstituted C2 to C30 alkenylene group; a C1 to C30 alkylene group or a C2 to C30 alkenylene group wherein a methylene moiety (—$CH_2$—) is replaced by a sulfonyl moiety (—S(=O)$_2$—), a carbonyl moiety (—C(=O)—), an ether moiety (—O—), a sulfide moiety (—S—), a sulfoxide moiety (—S(=O)—), an ester moiety (—C(=O)O—), an amide moiety (—C(=O)NR—) (wherein R is hydrogen or a C1 to C10 linear or branched alkyl group), an imine moiety (—NR—) (wherein R is hydrogen or a C1 to C10 linear or branched alkyl group), or a combination thereof, m is an integer of 1 or greater, k1 is an integer of 0 or 1 or greater, k2 is an integer of 1 or greater, a sum of m and k2 is an integer of 3 or greater, and when $Y_1$ is not a single bond, m does not exceed a valence of $Y_1$, and a sum of k1 and k2 does not exceed a valence of $L_1$.

The multi-functional thiol compound may be a dithiol compound, a trithiol compound, tetrathiol compound, or a combination thereof. For example, the thiol compound may be glycol (e.g., ethylene glycol) di-3-mercaptopropionate, glycol (e.g., ethylene glycol) dimercapto acetate, trimethylolpropane tris(3-mercaptopropionate), pentaerythritol tetrakis (3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 15 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight (or total solid content) of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt %, based on a total weight (or total solid content) of the composition or the composite.

The composition may further include an organic solvent (or a liquid vehicle). The organic solvent is not particularly limited. The organic solvent and an amount of the organic solvent may be appropriately determined by taking into consideration the above main components (i.e., the quantum dot, the dispersing agent, the polymerizable monomer, the initiator, and if used, the thiol compound,) and an additive and an amount of the additive which is described below. The composition may include an organic solvent in a residual amount except for a desired content of the (non-volatile) solid. Examples of the organic solvent (or liquid vehicle) may include ethyl 3-ethoxy propionate, ethylene glycols such as ethylene glycol, diethylene glycol, or polyethylene glycol; glycolethers such as ethylene glycolmonomethylether, ethylene glycolmonoethylether, diethylene glycolmonomethylether, ethylene glycoldiethylether, or diethylene glycoldimethylether; glycolether acetates such as ethylene glycol monomethyl ether acetate, ethylene glycolmonoethylether acetate, diethylene glycolmonoethylether acetate, or diethylene glycolmonobutylether acetate; propylene glycol; propylene glycolethers such as propylene glycolmonomethylether, propylene glycolmonoethylether, propylene glycolmonopropylether, propylene glycolmonobutylether, propylene glycoldimethylether, dipropylene glycoldimethylether, propylene glycoldiethylether, or dipropylene glycoldiethylether; propylene glycolether acetates such as propylene glycolmonomethylether acetate, or dipropylene glycolmonoethylether acetate; amides such as N-methylpyrrolidone, dimethyl formamide, or dimethyl acetamide; ketones such as methylethylketone (MEK), methylisobutylketone (MIBK), or cyclohexanone; petroleums such as toluene, xylene, or solvent naphtha; esters such as ethyl acetate, butyl acetate, or ethyl lactate; ethers such as diethyl ether, dipropyl ether, or dibutyl ether; aliphatic, alicyclic, or aromatic hydrocarbons; or a combination thereof.

If desired, the composition may further include various additives such as a light diffusing agent, a leveling agent, or a coupling agent in addition to the aforementioned components. The amount of the additive is not particularly limited, and may be controlled within an appropriate range wherein the additive does not cause an adverse effect on preparation of the composition and production of the quantum dot-polymer composite and optionally a patterning of the composite.

If used, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt %, based on a total weight of the composition, but is not limited thereto. If used, the content of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, based on a total weight of the composition, but is not limited thereto.

The film of the quantum dot-polymer composite or the quantum dot-polymer composite pattern that will be described below may have for example a thickness, less than or equal to about 30 micrometers (μm), for example less than or equal to about 25 μm, less than or equal to about 20 μm, less than or equal to about 15 μm, less than or equal to about 10 μm, less than or equal to about 8 μm, less than or equal to about 7 μm and greater than or equal to about 2 μm, for example, greater than or equal to about 3 μm, greater than or equal to about 3.5 μm, or greater than or equal to about 4 μm.

In an embodiment, a patterned film includes a repeating section including a first section configured to emit a first light, wherein the first section includes the quantum dot-polymer composite. The repeating section may include a second section emitting a second light having a different maximum (photoluminescence) peak wavelength from the first light, wherein the second section may include a quantum dot-polymer composite. The quantum dot-polymer composite of the second section may include a second quantum dot configured to emit the second light. The second quantum dot may include the aforementioned quantum dot. The first light or the second light may be red light having a maximum photoluminescence peak wavelength which is present between about 600 nm and about 650 nm (e.g., about 620 nm to about 650 nm) or green light having a maximum photoluminescence peak wavelength which is present between about 500 nm and about 550 nm (e.g., about 510 nm to about 540 nm). The patterned film may further include a third section emitting or passing a third light (e.g., blue light) different from the first light and the second light. The third light may have a maximum peak wavelength ranging from about 380 nm to about 480 nm.

An embodiment provides an electronic device including the quantum dot(s). The electronic device may include a light emitting diode (LED), an organic light emitting diode (OLED), a sensor, a solar cell, an imaging sensor, or a liquid crystal display (LCD), but is not limited thereto In an embodiment, the electronic device may be a photoluminescent device (e.g., a lighting system such as a quantum dot sheet, a quantum dot rail, or the like, or a liquid crystal display) or an electroluminescent device (e.g., quantum dot (QD) LED). In a non-limiting example, the electronic device may include a quantum dot sheet and the foregoing quantum dots may be included in the QD sheet for example, as a semiconductor nanocrystal-polymer composite.

In an embodiment, a display device includes a light source and a light emitting element (e.g., photoluminescence element), and the light emitting element includes the aforementioned quantum dot polymer composite and the light source may be configured to provide the light emitting element with incident light. The incident light may have a (photoluminescence) peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

In an embodiment, the light emitting element may include a sheet of the quantum dot polymer composite. The display device may further include a liquid crystal panel and the sheet of the quantum dot polymer composite may be disposed between the light source and the liquid crystal panel. FIG. 1 shows an exploded view of a display device. Referring to FIG. 1, the display device may have a structure wherein a reflector, a light guide panel (LGP) and a blue LED light source (Blue-LED), the quantum dot-polymer composite sheet (QD sheet), and various optical films such as a prism, double brightness enhance film (DBEF), and the like are stacked, and a liquid crystal (LC) panel is disposed thereon.

In an embodiment, the display device may include a stacked structure including a (e.g., transparent) substrate and a light emitting layer (e.g., a photoluminescent layer) disposed on the substrate as a light emitting element. In the stacked structure, the light emitting layer includes a pattern of the quantum dot polymer composite, and the pattern may include a, e.g., at least one, repeating section configured to emit light of a predetermined wavelength. The pattern of the quantum dot polymer composite may include a first repeating section that may emit a first light, a second repeating section that may emit a second light, or a combination thereof.

The first light and the second light have a different maximum photoluminescence peak wavelength in a photoluminescence spectrum. In an embodiment, the first light may be red light (R) having a maximum photoluminescence peak wavelength of about 600 nm to about 650 nm (e.g., about 620 nm to about 650 nm), the second light may be green light (G) having a maximum photoluminescence peak wavelength of about 500 nm to about 550 nm (e.g., about 510 nm to about 550 nm), or vice versa (i.e., the first light may be a green light and the second light may be a red light).

The substrate may be a substrate including an insulation material. The substrate may include glass; various polymers such as a polyester (e.g., poly(ethylene terephthalate) (PET), poly(ethylene naphthalate) (PEN), or the like), a polycarbonate, a poly(C1 to C10 alkyl (meth)acrylate), a polyimide, a polyamide, or a combination thereof (e.g., a copolymer or a mixture thereof); a polysiloxane (e.g., PDMS); an inorganic material such as $Al_2O_3$ or ZnO; or a combination thereof, but is not limited thereto. A thickness of the substrate may be desirably selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

At least a portion of the substrate may be configured to cut (absorb or reflect) blue light. A layer capable of blocking (e.g., absorbing or reflecting) blue light, also referred to herein as a "blue cut layer" or "blue light absorption layer", may be disposed on a, e.g., at least one, surface of the substrate. For example, the blue cut layer (blue light absorption layer) may include an organic material and a predetermined dye, such as, for example, a yellow dye or a dye capable of absorbing blue light and transmitting green light, red light, or green light and red light.

In an embodiment, a method of producing the stacked structure includes forming a film of the above composition on a substrate;

exposing a selected region of the film to light (e.g., having a wavelength of less than or equal to about 400 nm); and developing the exposed film with an alkali developing solution to obtain a pattern of the quantum dot polymer composite.

The details of the substrate and the composition are the same as described above.

The composition is coated to have a predetermined thickness on a substrate in an appropriate method of spin coating, slit coating, and the like. If desired, the formed film may be pre-baked (PRB). Conditions (such as a temperature, a duration, and an atmosphere) for the pre-baking may be selected appropriately.

The formed (and optionally, pre-baked) film is exposed to light of a predetermined wavelength (UV light) under a mask having a predetermined pattern. The wavelength and the intensity of light may be selected taking into consideration the types and the amounts of the photoinitiator, the types and the amounts of quantum dots, or the like.

The film having the exposed selected area is treated (e.g., sprayed or immersed) with an alkali developing solution, and thereby the unexposed region in the film is dissolved to provide a desired pattern, which may be referred to as development. The obtained pattern may be post-baked (FOB), if desired, for example, at a temperature of about 150° C. to about 230° C. for a predetermined time, for example, greater than or equal to about 10 minutes (min) or greater than or equal to about 20 min, in order to improve crack resistance and solvent resistance of the pattern.

When the quantum dot-polymer composite pattern has a plurality of repeating sections, a quantum dot-polymer composite having a desired pattern may be obtained by preparing a plurality of compositions including a quantum dot (e.g., a red light emitting quantum dot, a green light emitting quantum dot, or optionally, a blue light emitting quantum dot) having desired photoluminescence properties (a photoluminescence peak wavelength and the like) to form each repeating section and repeating the pattern formation process for each of the composition as many times (e.g., twice or more or three times or more) as desired to form a desired pattern of the quantum dot polymer composite.

In an embodiment, an ink composition of an embodiment including the population of the cadmium free quantum dots and the liquid vehicle may be used to form a pattern. For example, a pattern may be formed by depositing the ink composition including a plurality of cadmium free quantum dots, a liquid vehicle, and a monomer on a desired region of a substrate, optionally removing the liquid vehicle and conducting a polymerization.

For example, the quantum dot-polymer composite may be in the form of a pattern of at least two different repeating color sections (e.g., RGB sections). Such a quantum dot-polymer composite pattern may be used as a photoluminescence-type color filter in a display device.

In an embodiment, a display device includes a light source and a light emitting element including a stacked structure (hereinafter, also referred to as a layered structure).

The light source may be configured to provide incident light to the light emitting element including the layered structure. The incident light may have a wavelength of about 440 nm to about 480 nm such as about 440 nm to about 470 nm. The incident light may be a third light.

In a display device including the stacked structure, the light source may include a plurality of light emitting units respectively corresponding to the first section and the second section, and the light emitting units may include a first electrode and a second electrode facing each other and an electroluminescent layer disposed between the first electrode and the second electrode. The electroluminescent layer may include an organic light emitting material.

For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device such as the organic light emitting diode (OLED) are not particularly limited.

Figure 2A:
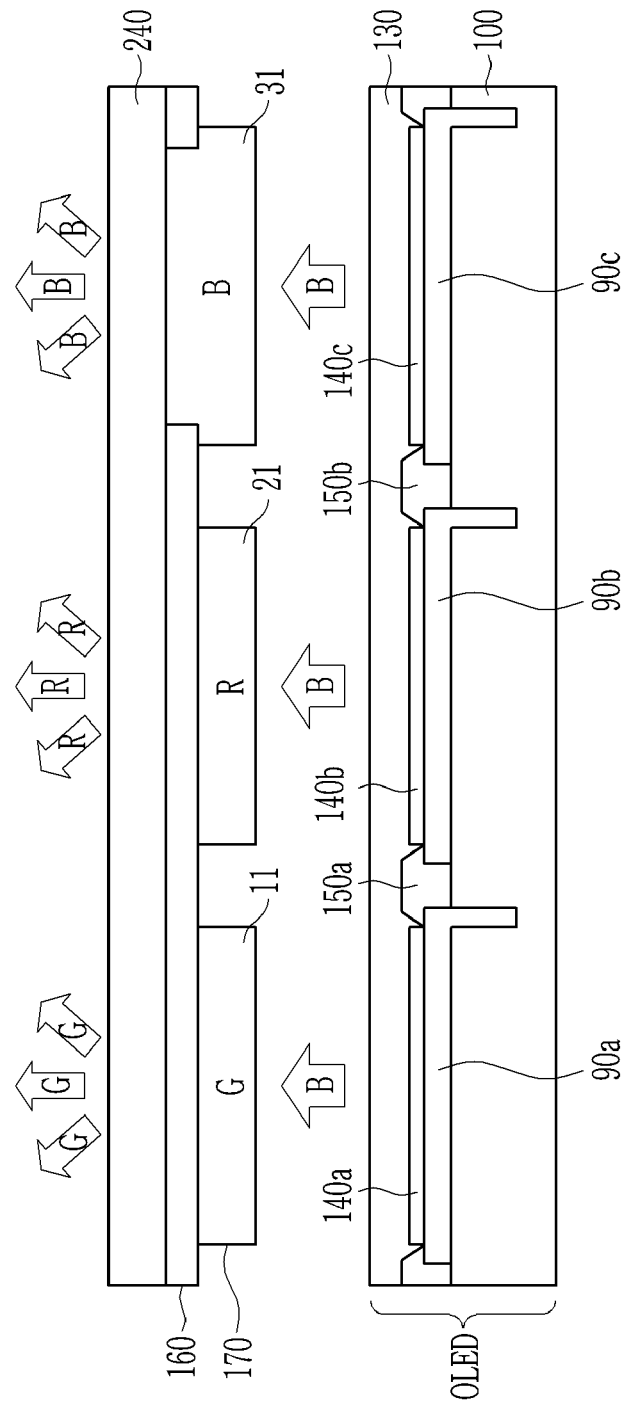
FIG. 2A is a schematic cross-sectional view of a display device according to an embodiment.
Figure 2B:
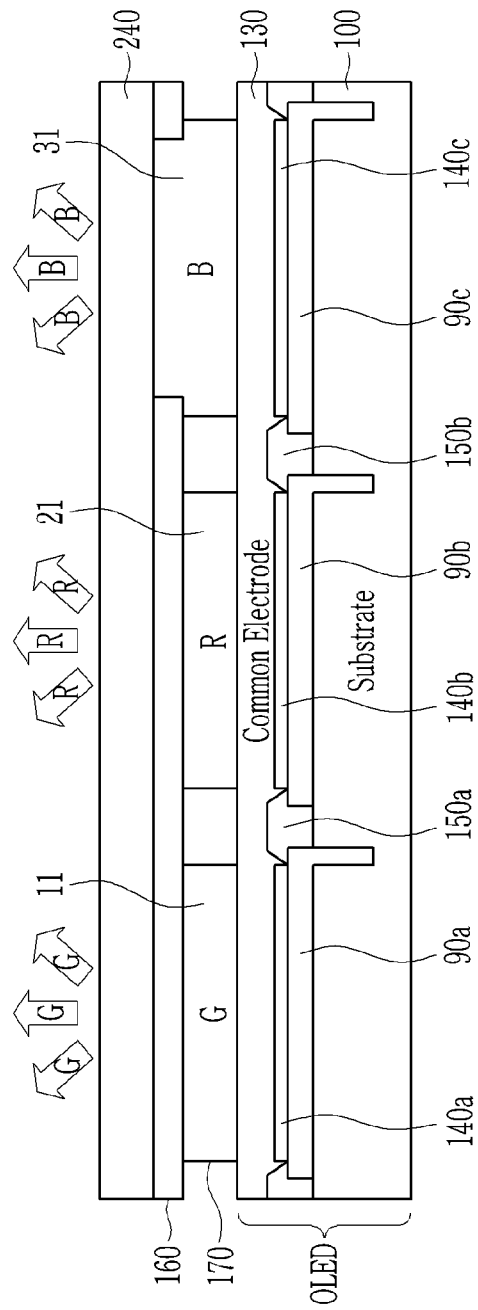
FIG. 2B is a schematic cross-sectional view of a display device according to an embodiment.

FIGS. 2A and 2B are schematic cross-sectional views of display devices according to embodiments. Referring to FIGS. 2A and 2B, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode (OLED). The pixel areas of the OLED may be disposed corresponding to the first, second, and third sections that will be described in detail below, respectively.

The stacked structure that includes a quantum dot-polymer composite pattern (e.g., including a first repeating section including green light emitting quantum dots, a second repeating section including red light emitting quantum dots, or a combination thereof) and a substrate, or the quantum dot-polymer composite pattern, may be disposed on or over a light source, for example, directly on the light source.

The sections are configured so that blue light emitted from the light source is entered thereinto and red light and green light may be emitted therefrom, respectively. Blue light emitted from the light source may pass through the third section.

The light (e.g., blue light) emitted from the light source may enter the second section 21 and the first section 11 of the pattern 170 to emit (e.g., converted) red light R and green light G, respectively. The blue light B emitted from the light source passes through or transmits from the third section 31. Over the second section 21 emitting red light, the first section 11 emitting green light, or a combination thereof, an optical element 160 may be disposed. The optical element may be a blue cut layer which cuts (e.g., reflects or absorbs) blue light and optionally green light, or a first optical filter. The blue cut layer 160 may be disposed on the upper substrate 240. The blue cut layer 160 may be disposed under the upper substrate 240 (e.g., on a bottom surface of the upper substrate 240). The blue cut layer 160 may be disposed between the upper substrate 240 and the quantum dot-polymer composite pattern and over the first section 11 and the second section 21. Details of the blue cut layer are the same as set forth for the first optical filter 310 below.

The display device may be obtained by separately fabricating the stack structure and (e.g., blue light emitting) LED or OLED and then assembling the same. Alternatively, the display device may be obtained by forming a quantum dot-polymer composite pattern directly on the LED or OLED.

In an embodiment, the display device may further include a lower substrate 210, an optical element (e.g., polarizer) 300 disposed below the lower substrate 210, and a liquid crystal layer 220 interposed between the layered structure and the lower substrate 210. The layered structure may be disposed in such a manner that a light emitting layer (i.e., the quantum dot-polymer composite pattern) faces the liquid crystal layer. The display device may further include an optical element (e.g., polarizer) 300 between the liquid crystal layer 220 and the light emitting layer. The light source may further include an LED and optionally a light guide panel.

Figure 3:
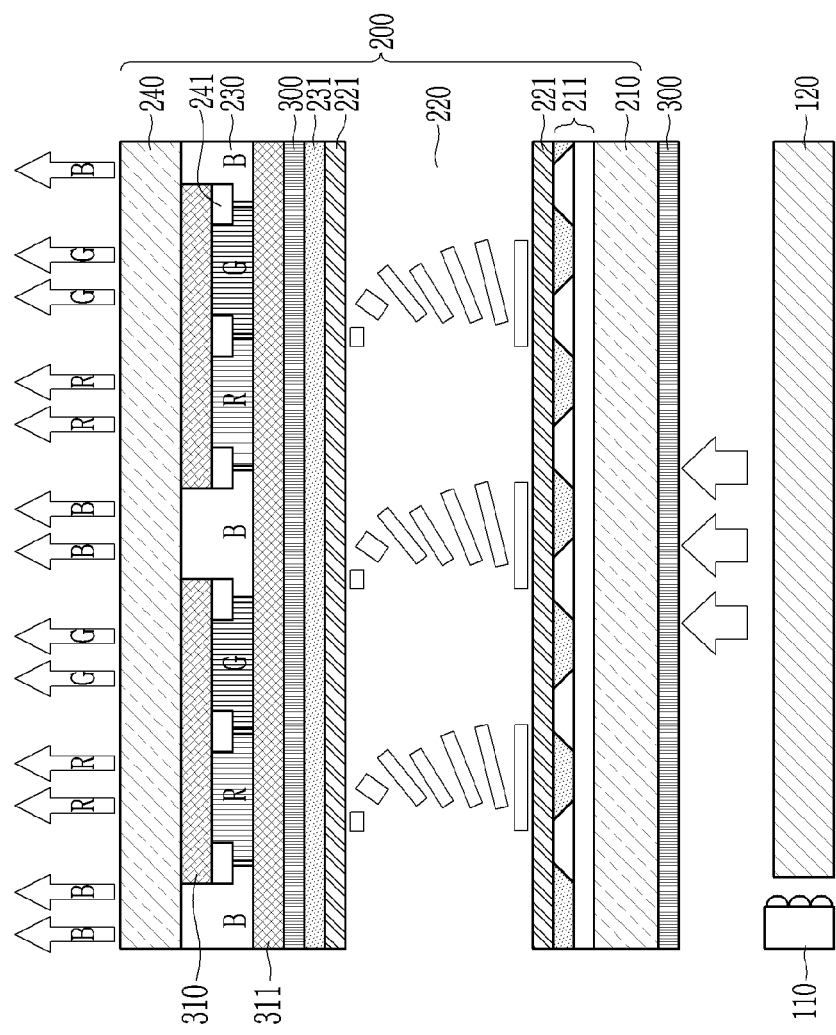
FIG. 3 is a schematic cross-sectional view of a display device according to an embodiment.

Referring to FIG. 3, in an embodiment, the display device includes a liquid crystal panel 200, a lower optical element 300 (e.g., polarizer) disposed on the liquid crystal panel 200, under the liquid crystal panel 200, or a combination thereof, and a backlight unit including a blue light emitting light source 110 under a lower optical element 300. The backlight unit may include a light source 110 and a light guide panel 120 (edge type). Alternatively, the backlight unit may be a direct light source without a light guide panel. The liquid crystal panel 200 may include a lower substrate 210, an upper substrate 240, and a liquid crystal layer 220 between the upper and lower substrates, and a light emitting layer (color filter layer) 230 disposed on or under the upper substrate 240. The light emitting layer 230 may include the quantum dot-polymer composite (or a pattern thereof).

A wire plate 211 is provided on an internal surface, for example, on the upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on an upper surface of the liquid crystal layer 220 and on a lower surface of the liquid crystal layer 220, to initially align the liquid crystal material included therein. Details regarding a liquid crystal material, an alignment layer material, a method of forming an alignment layer, a method of forming a liquid crystal layer, a thickness of liquid crystal layer, or the like are not particularly limited.

In an embodiment, an upper optical element or an upper polarizer 300 may be provided between the liquid crystal layer 220 and the upper substrate 240, but it is not limited thereto. For example, the upper optical element or upper polarizer 300 may be disposed between the liquid crystal layer 220 (or a common electrode 231) and the light emitting layer (or the quantum dot-polymer composite pattern). A black matrix 241 may be provided under the upper substrate 240 (e.g., on a lower surface thereof). Openings within the black matrix 241 are aligned with (or provided to hide) a gate line, a data line, and a thin film transistor of a wire plate 211 on the lower substrate 210. A second section (R) including a color filter emitting red light, a first section (G) including a color filter emitting green light, a third section (B) including a color filter for emitting or transmitting blue light, or a combination thereof may be disposed in the openings within the black matrix 241 (BM). For example, the black matrix 241 may have a lattice shape. If desired, the light emitting layer may further include a, e.g., at least one, fourth repeating section. The fourth repeating section may be configured to emit light having a color (e.g., cyan, magenta, yellow, or the like) different from the colors of the light emitted from the first to third sections.

The light emitting layer (color filter layer) 230 may be on a transparent common electrode 231.

If desired, the display device may further include a blue cut filter 310, hereinafter, also referred to as a first optical filter layer 310. The first optical filter layer 310 may be disposed between upper surfaces of the second section (R) and the first section (G) and the lower surface of the upper substrate 240, or on an upper surface of the upper substrate 240. The first optical filter layer 310 may include a sheet having openings that correspond to the third section (B) (e.g., a pixel area showing, e.g., emitting, a blue color) and may be formed on portions corresponding to the first and second sections (G, R). The first optical filter layer 310 may be formed as a single body structure over the portions of the light emitting layer 230 corresponding to the first and second sections (G, R), and which are other than the portions overlapping the third section, but is not limited thereto. Alternatively, at least two first optical filter layers may be spaced apart from each other and may be disposed over each of the portions overlapping the first and the second sections, respectively.

For example, the first optical filter layer may block light having a predetermined wavelength range in the visible light range and may transmit light having another wavelength range. For example, the first optical filter layer may block blue light and transmit light other than blue light. For example, the first optical filter layer may transmit green light, red light, or yellow light (e.g., a mixture of green light and red light).

The first optical filter layer may include a polymer thin film including a dye that absorbs light having a specific wavelength, i.e., the wavelength to be blocked, a pigment that absorbs light having a specific wavelength, or a combination thereof. The first optical filter layer may block at least 80%, at least 90%, or at least 95% of blue light having a wavelength of less than or equal to about 480 nm. With respect to the visible light having other wavelengths, the first optical filter layer may have a light transmittance of greater than or equal to about 70%, for example, greater than or equal to about 80%, greater than or equal to about 90%, or up to 100%.

The first optical filter layer may absorb and substantially block blue light having a wavelength of less than or equal to about 500 nm, and for example, may selectively transmit green light or red light. In this case, at least two first optical filter layers may be spaced apart and disposed on each of the portions overlapping the first and second sections, respectively. For example, the first optical filter layer selectively transmitting red light may be disposed on the portion overlapping the section emitting red light and the first optical filter layer selectively transmitting green light may be disposed on the portion overlapping the section emitting green light.

In an embodiment, the first optical filter layer may include a first region, a second region, or a first region and a second region. The first region of the first optical filter layer blocks (e.g., absorbs) blue light and red light and transmits light having a wavelength of a predetermined range, e.g., a wavelength greater than or equal to about 500 nm, greater than or equal to about 510 nm, or greater than or equal to about 515 nm, and less than or equal to about 550 nm, less than or equal to about 540 nm, less than or equal to about 535 nm, less than or equal to about 530 nm, less than or equal to about 525 nm, or less than or equal to about 520 nm. The second region of the first optical filter layer blocks (e.g., absorb) blue light and green light and transmits light having a wavelength of a predetermined range, e.g., a wavelength of greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm. The first region of the first optical filter layer may be disposed (directly) on or over a location overlapping a green light emitting section and the second region of the first optical filter layer may be disposed (directly) on or over a location overlapping a red light emitting section. The first region and the second region may be optically isolated from one another, for example, by a black matrix. The first optical filter layer may contribute to improving the color purity of a display device.

The first optical filter layer may be a reflection type filter including a plurality of layers (e.g., inorganic material layers) each having a different refractive index. For example, in the first optical filter layer, two layers having different refractive indices may be alternately stacked on each other. For example, a layer having a high refractive index and a layer having a low refractive index may be alternately laminated with each other.

The display device may further include a second optical filter layer 311 (e.g., red/green light or yellow light recycling layer) that is disposed between the light emitting layer 230 and the liquid crystal layer 220, and between the light emitting layer 230 (e.g., the quantum dot polymer composite layer) and the upper polarizer 300. The second optical filter layer 311 may transmit at least a portion of a third light, and reflect at least a portion of a first light, at least a portion of a second light, or at least a portion of a first light and a second light. The second optical filter layer may reflect light having a wavelength of greater than 500 nm. The first light may be green (or red) light, the second light may be red (or green) light, and the third light may be blue light.

Figure 4:
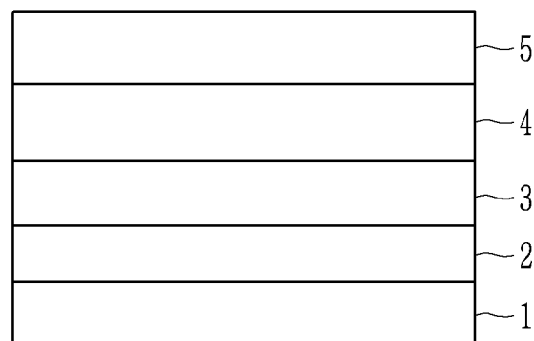
FIG. 4 is a schematic cross-sectional view of a light emitting device according to an embodiment.

The quantum dots may be used in a luminescent layer in a quantum dot based electroluminescent device (see FIG. 4). The electroluminescent device may include an anode 1 and a cathode 5 facing each other; a quantum dot emission layer 3 disposed between the anode and the cathode and including a plurality of quantum dots, and a hole auxiliary layer 2 disposed between the anode and the quantum dot emission layer. The hole auxiliary layer may include a hole injecting layer (HIL), a hole transporting layer (HTL), an electron blocking layer (EBL), or a combination thereof. The hole auxiliary layer may include a suitable organic/inorganic material having a hole property. The electroluminescent device may further include an electron auxiliary layer 4 between the cathode and the quantum dot emission layer. The electron auxiliary layer may include an electron injecting layer (EIL), an electron transporting layer (ETL), a hole blocking layer (HBL), or a combination thereof. The electron auxiliary layer may include a suitable organic/inorganic material having an electron property.

Hereinafter, embodiments are illustrated in more detail with reference to specific examples. However, they are exemplary examples of the present disclosure, and the present disclosure is not limited thereto.

EXAMPLES

Analysis Method
1. Photoluminescence Analysis

A photoluminescence (PL) spectrum of the produced nanocrystals are obtained using a Hitachi F-7000 spectrometer at an irradiation wavelength of 372 nanometers (nm).
2. Ultraviolet (UV) Spectroscopy Analysis UV spectroscopy analysis is performed using an Agilent Cary 5000 spectrometer to obtain a UV-Visible absorption spectrum.
3. Inductively Coupled Plasma (ICP) Analysis An inductively coupled plasma-atomic emission spectroscopy (ICP-AES) analysis is performed using Shimadzu ICPS-8100.

Synthesis is performed under an inert gas atmosphere (nitrogen flowing condition) unless particularly mentioned.

Synthesis of Quantum Dot Having a ZnTeSe Core and a ZnSeS Shell

Example 1

Selenium and tellurium are dispersed in trioctylphosphine (TOP) to obtain a 0.4 molar (M) Se/TOP stock solution and a 0.5 M Te/TOP stock solution. The Se/TOP stock solution, the Te/TOP stock solution, and an organic ligand including oleyl amine, and lithium triethylborohydride are mixed (e.g., at room temperature) to provide a reaction solution.

In a 300 milliliters (mL) reaction flask, 0.9 mmol of zinc acetate is dissolved in trioctylamine together with oleic acid, and is heated under vacuum at 120° C. In one hour, an atmosphere in the reactor is replaced with an inert atmosphere and a reaction system is heated to 300° C.

The reaction solution is injected into the heated reaction system and the reaction is carried out and terminated.

The reactor is cooled to room temperature and acetone is added thereto to obtain precipitates, which are separated via centrifugation. The obtained ZnTeSe quantum dots are dispersed in toluene.

The used amounts of Zn, Se, and a Li compound with respect to one mole of Te is 4.5 moles, 0.5 moles, and 1 mole, respectively.

With respect to the ZnTeSe quantum dots as prepared, an inductively coupled plasma atomic emission spectroscopic analysis is made and the results are summarized in Table 1.

Figure 5:
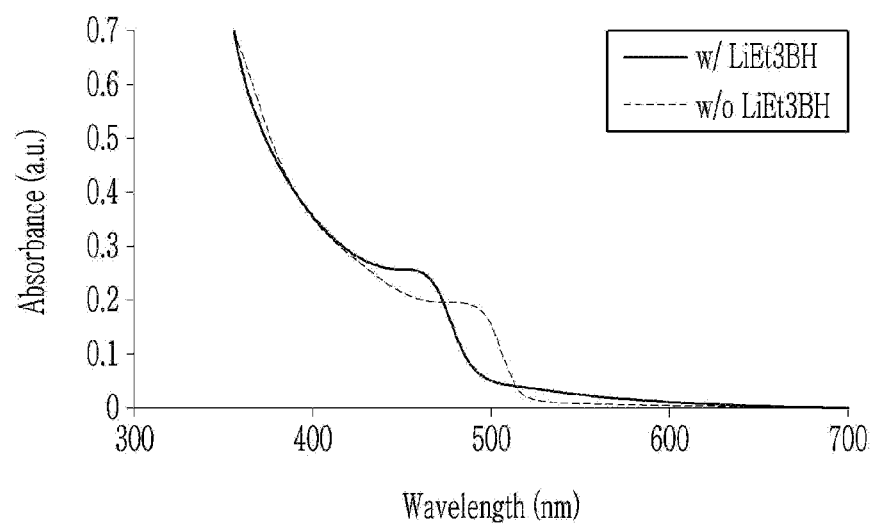
FIG. 5 is a UV-Vis absorption spectrum of Absorbance (arbitrary units (a.u.)) versus Wavelength (nm) of a quantum dot synthesized in Example 1 (w/10 LiEt3BH) and Comparative Example 1 (w/o LiEt3BH).
Figure 6:
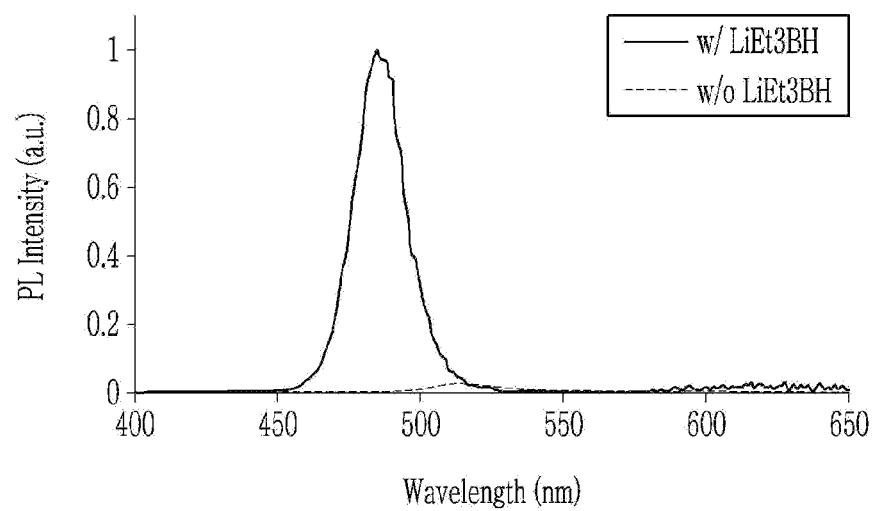
FIG. 6 is a photoluminescent spectrum of Photoluminescence (PL) Intensity (arbitrary units (a.u.)) versus Wavelength (nm) of a quantum dot synthesized in Example 1 and Comparative Example 1.

With respect to the ZnTeSe quantum dots as prepared, a UV-Vis absorption spectroscopy analysis and a photoluminescent spectroscopy analysis are made and the results are summarized in FIGS. 5, 6 and Table 2.

Comparative Example 1

A ZnTeSe quantum dot is prepared in the same manner as Example 1 except for not using lithium triethylborohydride.

With respect to the quantum dots as prepared, an inductively coupled plasma atomic emission spectroscopic analysis is made and the results are summarized in Table 1.

With respect to the ZnTeSe quantum dots as prepared, a UV-Vis absorption spectroscopy analysis and a photoluminescent spectroscopy analysis are made and the results are summarized in FIGS. 5, 6 and Table 2.

Comparative Example 2

A semiconductor nanocrystal particle is prepared in the same manner as Example 1 except for not using the oleyl amine.

With respect to the ZnTeSe quantum dots as prepared, a UV-Vis absorption spectroscopy analysis and a photoluminescent spectroscopy analysis are made and the results are summarized in Table 2.

Example 2

Sulfur is dispersed in trioctylphosphine (TOP) to obtain a 1.0 molar (M) S/TOP stock solution.

In a 300 mL reaction flask, trioctylamine (TOA) is placed and 0.9 mmol of zinc acetate and oleic acid are dissolved therein, then the mixture is vacuum-treated at 120° C. After the atmosphere in the flask is replaced with an inert atmosphere, the flask is heated to 200° C.

A toluene dispersion of the ZnTeSe quantum dots prepared in Example 1 is injected rapidly and then the Se/TOP stock solution and the S/TOP stock solution are added thereto and the reaction proceeds for 30 minutes.

After the completion of the reaction, the flask is cooled to room temperature and the prepared ZnTeSe/ZnSeS core-shell quantum dots are recovered via precipitation using acetone and centrifugation. The obtained core-shell quantum dots are dispersed in toluene.

With respect to the 0.9 Moles of the zinc precursor, 0.1 moles of the Se precursor and 0.1 moles of the S precursor are used respectively.

With respect to the core-shell quantum dots as prepared, an inductively coupled plasma atomic emission spectroscopic analysis is made and the results are summarized in Table 1.

With respect to the quantum dots as prepared, a UV-Vis absorption spectroscopy analysis and a photoluminescent spectroscopy analysis are made and the results are summarized in Table 2.

TABLE 1

| | Molar Ratio (X:Te) | | | | | |
| --- | --- | --- | --- | --- | --- | --- |
| | Li | Zn | Se | Te | S | $ZnTe_xSe_{(1-x)}$ |
| Example 1 | 0.50:1 | 1.46:1 | 0.45:1 | 1.00:1 | — | X = 0.69 |
| Example 2 | 0.45:1 | 4.45:1 | 1.14:1 | 1.00:1 | 2.2:1 | X = 0.47 |

TABLE 1-continued

| | Molar Ratio (X:Te) | | | | | |
| --- | --- | --- | --- | --- | --- | --- |
| | Li | Zn | Se | Te | S | $ZnTe_xSe_{(1-x)}$ |
| Comparative Example 1 | 0:1 | 1.28:1 | 0.48:1 | 1.00:1 | — | X = 0.68 |

The results of Table 1 confirm that the quantum dots of Examples include lithium.

TABLE 2

| | PL wavelength (nm) | Quantum Yield (QY) (%) | Full Width at Half Maximum (FWHM) (nm) |
| --- | --- | --- | --- |
| Example 1 | 480 | 1 | 20 |
| Example 2 | 487 | 10 | 30 |
| Comparative Example 1 | N/A | No emission | — |
| Comparative Example 2 | N/A | — | — |

The results of Table 2 confirm that the quantum dots of the Examples may have enhanced optical properties (e.g., a narrow FWHM and an increased luminous efficiency).

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A cadmium free quantum dot comprising:
   zinc, tellurium, and selenium, and
   lithium,
   wherein the cadmium free quantum dot does not comprise an indium phosphide,
   wherein the cadmium free quantum dot has a quantum efficiency of greater than or equal to about 5%, and
   wherein a mole ratio of tellurium to selenium (Te:Se) is greater than or equal to 1:1 and less than or equal to about 4:1.

2. The cadmium free quantum dot of claim 1, wherein the cadmium free quantum dot comprises a semiconductor nanocrystal core comprising zinc, selenium, and tellurium and a shell disposed on the semiconductor nanocrystal core.

3. The cadmium free quantum dot of claim 1, wherein a full width at half maximum of a maximum luminescent peak of the cadmium free quantum dot is less than or equal to 35 nanometers.

4. The cadmium free quantum dot of claim 2, wherein the semiconductor nanocrystal core comprises $ZnTe_xSe_{1-x}$, wherein x is greater than or equal to 0.5 and less than or equal to about 0.9.

5. The cadmium free quantum dot of claim 1, wherein the amount of the lithium is greater than or equal to about 0.01 moles and less than or equal to about 1:1 with respect to 1 mole of tellurium.

6. The cadmium free quantum dot of claim 1, wherein the mole ratio of tellurium with respect to selenium (Te:Se) is less than or equal to about 1.5:1.

7. The cadmium free quantum dot of claim 1, wherein the mole ratio of tellurium with respect to zinc (Te:Zn) is greater than or equal to about 0.1:1 and less than or equal to about 0.85:1.

8. The cadmium free quantum dot of claim 1, wherein the cadmium free quantum dot further comprises sulfur, and a mole ratio of the sulfur to zinc is greater than or equal to about 0.1:1 and less than or equal to about 0.6:1.

9. The cadmium free quantum dot of claim 1, the maximum luminescent peak of the cadmium free quantum dot is present in a wavelength range of greater than or equal to 505 nanometers and less than or equal to about 560 nanometers.

10. The cadmium free quantum dot of claim 1, wherein the quantum dot has a quantum efficiency of greater than or equal to about 10%.

11. The cadmium free quantum dot of claim 1, wherein the quantum dot has a quantum efficiency of greater than or equal to about 18%.

12. A quantum dot polymer composite comprising
a polymer matrix; and
a plurality of quantum dots dispersed in the polymer matrix,
wherein the plurality of quantum dots comprises the cadmium free quantum dot of claim 1.

13. A display device comprising
a light emitting element, and optionally a light source that is configured to provide incident light to the light emitting element,
wherein the light emitting element comprises a cadmium free quantum dot of claim 1.

14. An electroluminescent device comprising an anode and a cathode, and a quantum dot emission layer disposed between the anode and the cathode, wherein the quantum dot emission layer comprises the quantum dot of claim 1.

15. A cadmium free quantum dot comprising:
zinc, tellurium, and selenium, and
lithium,
wherein the cadmium free quantum dot has a quantum efficiency of greater than or equal to about 10%,
wherein the cadmium free quantum dot comprises
a core comprising a first semiconductor nanocrystal material and
a semiconductor nanocrystal shell disposed on the core,
wherein the core comprises $ZnTe_xSe_{1-x}$, wherein x is greater than or equal to 0.5 and less than or equal to about 0.9, and the semiconductor nanocrystal shell comprises ZnSe, ZnS, ZnSeS, or a combination thereof.

16. A display device comprising
a light emitting element,
wherein the light emitting element comprises a cadmium free quantum dot of claim 15.

17. An electroluminescent device comprising an anode and a cathode, and a quantum dot emission layer disposed between the anode and the cathode, wherein the quantum dot emission layer comprises the quantum dot of claim 15.

* * * * *